United States Patent
Tan et al.

(10) Patent No.: US 8,946,806 B2
(45) Date of Patent: Feb. 3, 2015

(54) MEMORY CELL WITH DECOUPLED CHANNELS

(75) Inventors: Shyue Seng Tan, Singapore (SG); Eng Huat Toh, Singapore (SG); Elgin Quek, Singapore (SG); Yanzhe Tang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 805 days.

(21) Appl. No.: 13/189,554

(22) Filed: Jul. 24, 2011

(65) Prior Publication Data

US 2013/0020626 A1 Jan. 24, 2013

(51) Int. Cl.
| | |
|---|---|
| H01L 29/788 | (2006.01) |
| H01L 21/336 | (2006.01) |
| G11C 16/04 | (2006.01) |
| H01L 21/28 | (2006.01) |
| H01L 29/423 | (2006.01) |
| H01L 29/66 | (2006.01) |
| H01L 27/115 | (2006.01) |

(52) U.S. Cl.
CPC .......... *G11C 16/04* (2013.01); *H01L 21/28273* (2013.01); *H01L 29/42324* (2013.01); *H01L 29/42328* (2013.01); *H01L 29/66825* (2013.01); *H01L 29/7883* (2013.01); *H01L 27/11521* (2013.01)
USPC ........... 257/316; 257/319; 257/314; 257/315; 257/E21.422; 257/E21.632

(58) Field of Classification Search
CPC .................. H01L 27/11521; H01L 29/42324; H01L 29/42328; H01L 29/66825
USPC .......... 257/316, E21.422, E21.632, 319, 314, 257/315
See application file for complete search history.

(56) References Cited

U.S. PATENT DOCUMENTS

| | | | |
|---|---|---|---|
| 6,706,592 B2 | 3/2004 | Chern et al. | |
| 2006/0202256 A1* | 9/2006 | Harari | 257/315 |

OTHER PUBLICATIONS

Silicon Storage Technology Inc., SuperFlash Cell Technology, http://www.sst.com/superflash/superflash_cell/, 2011.
Viktor Markov et al., SuperFlash Memory Program/Erase Endurance, Silicon Storage Technology, Inc., www.sst.com/dotAsset/43129.pdf, California, 2003.
Hung-Cheng Sung et al., Novel Program Versus Disturb Window Characterization for Split-Gate Flash Cell, IEEE Electron Device Letters, Mar. 2005, vol. 26, No. 3, pp. 194-196.
Caleb Yu-Sheng Cho et al., A Novel Self-Aligned Highly Reliable Sidewall Split-Gate Flash Memory, IEEE Transactions on Electron Devices, Mar. 2006, vol. 53, No. 3, pp. 465-473.

* cited by examiner

*Primary Examiner* — Cathy N Lam
(74) *Attorney, Agent, or Firm* — Horizon IP Pte Ltd

(57) ABSTRACT

A device having a substrate prepared with a memory cell region having a memory cell is disclosed. The memory cell includes an access transistor and a storage transistor. The access transistor includes first and second source/drain (S/D) regions and the storage transistor includes first and second storage S/D regions. The access and storage transistors are coupled in series and the second S/D regions being a common S/D region. An erase gate is disposed over the common S/D region. A program gate is disposed over the first storage S/D region. Such an arrangement of the memory cell decouples a program channel and an erase channel.

21 Claims, 23 Drawing Sheets

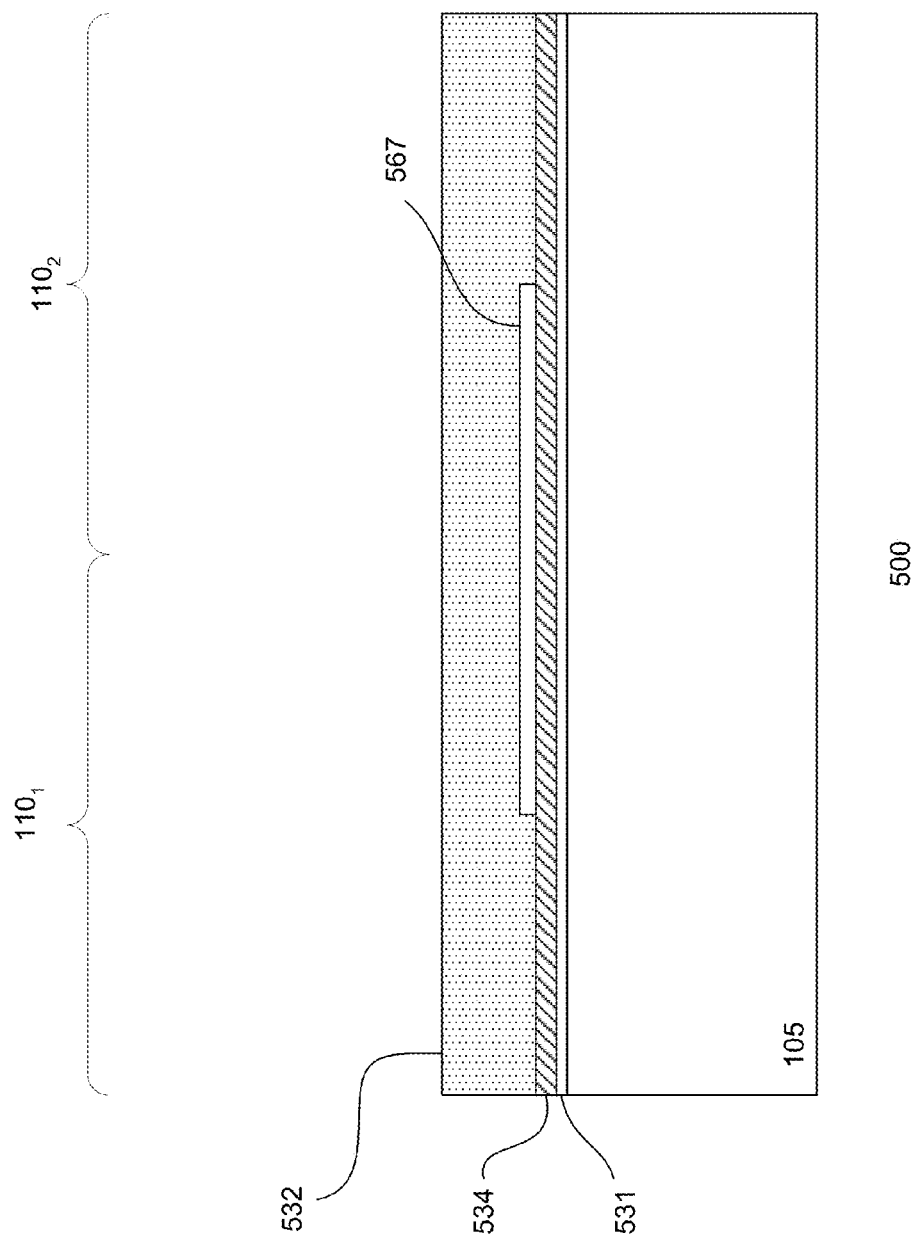

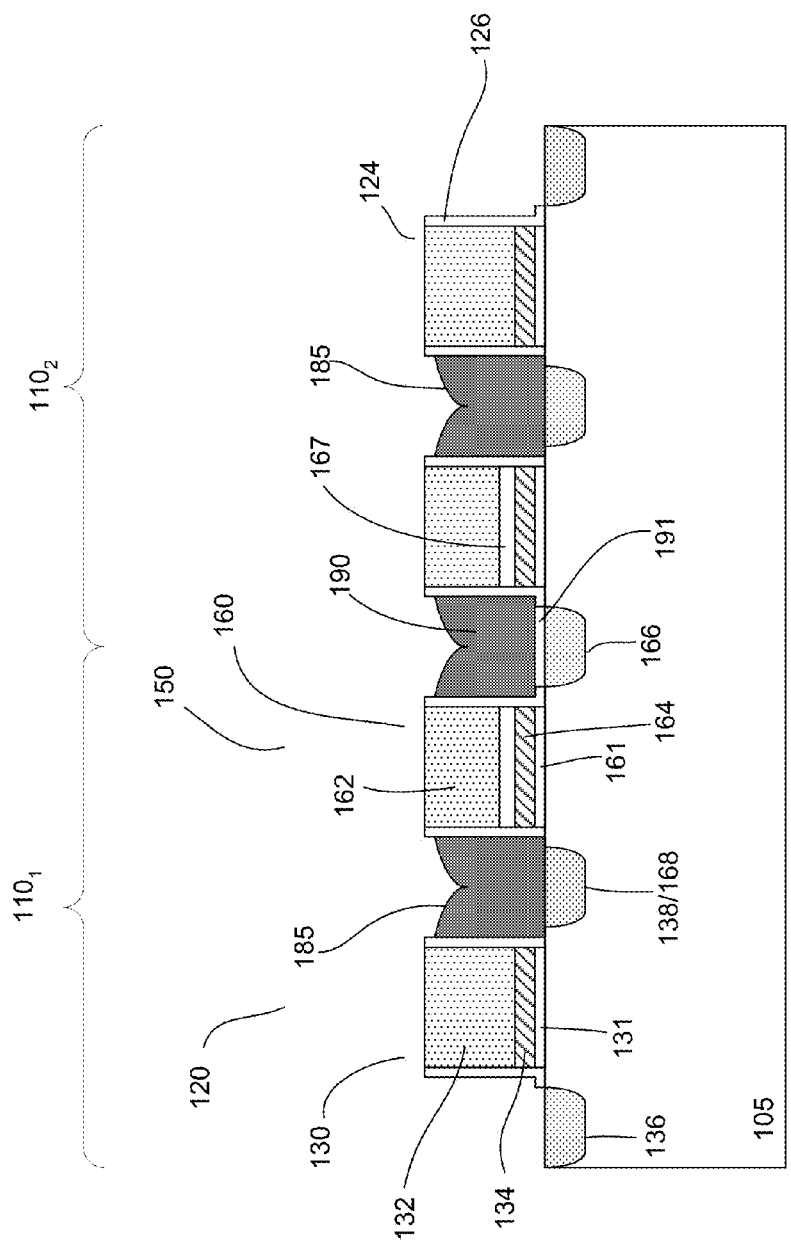

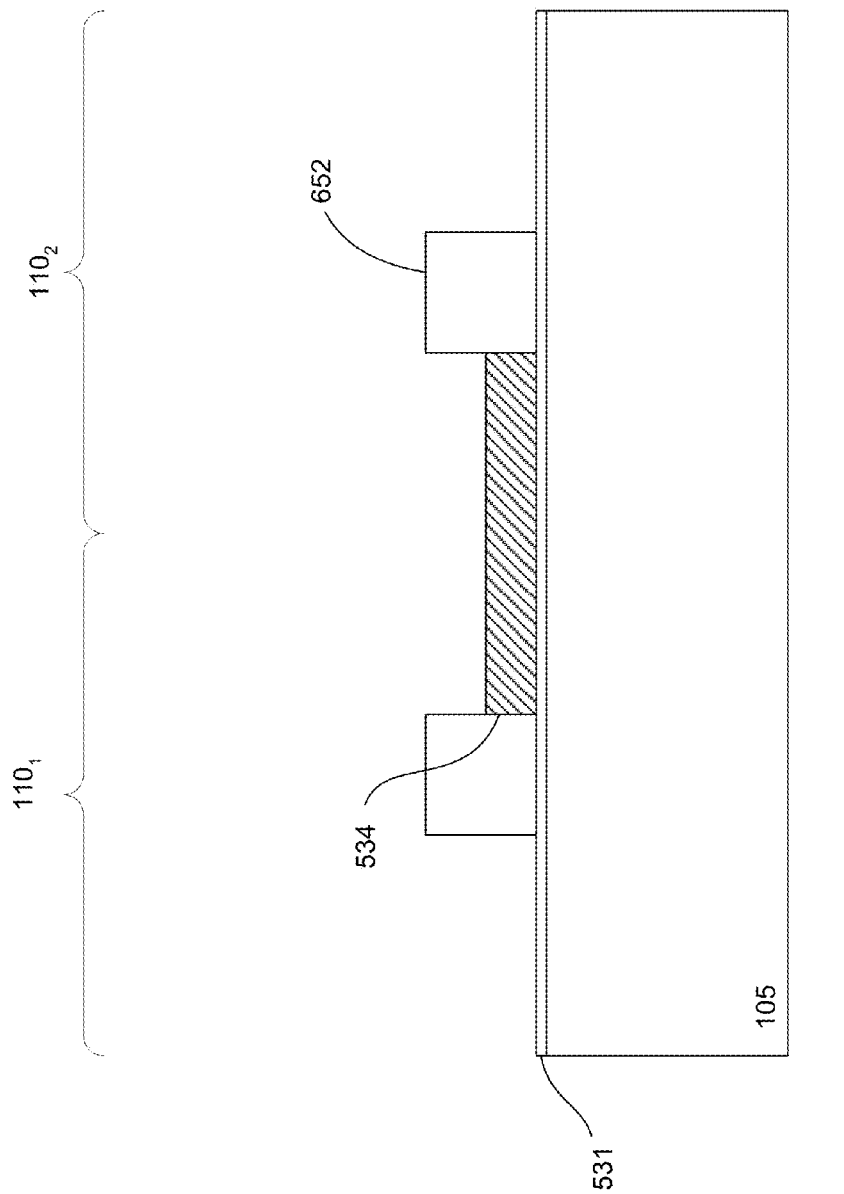

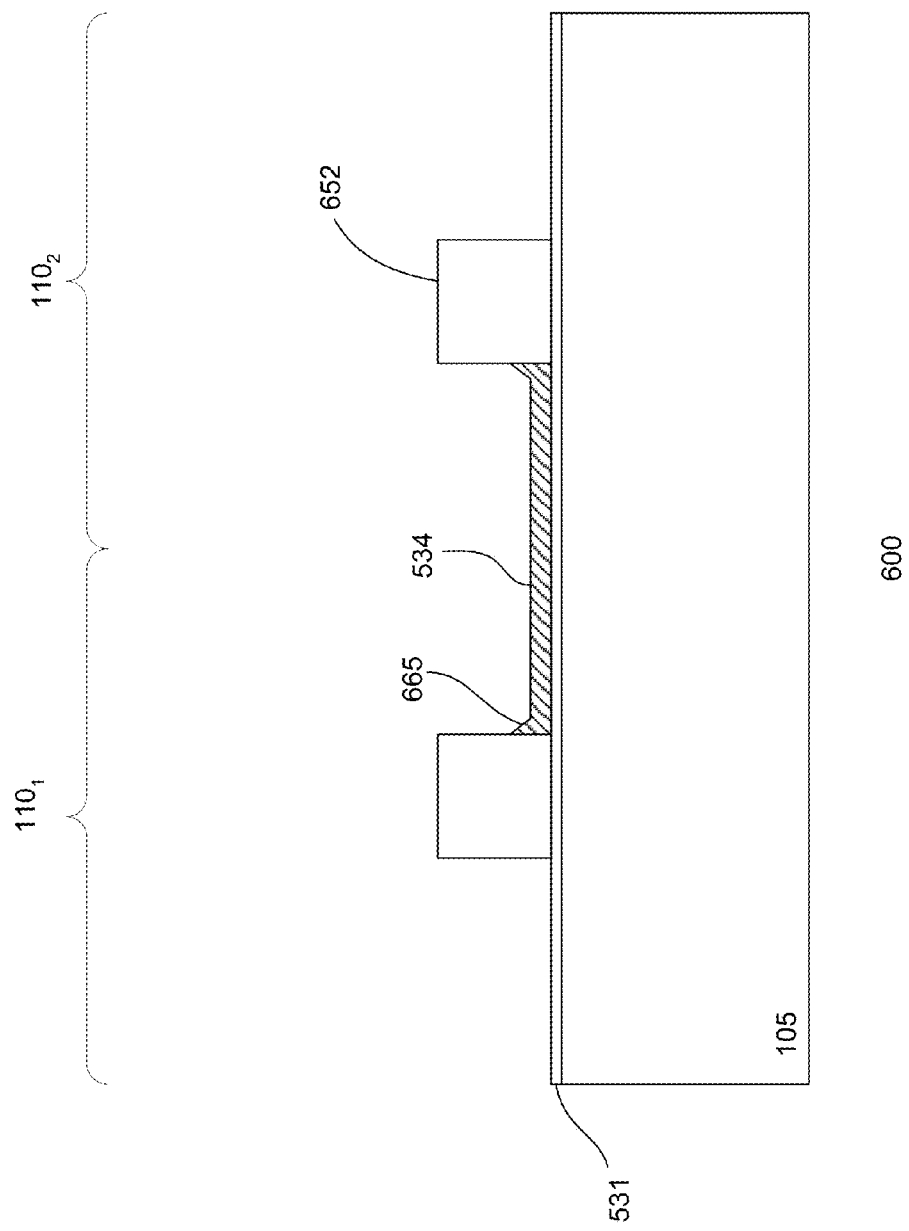

MEMORY CELL WITH DECOUPLED CHANNELS

BACKGROUND

Non-volatile memory (NVM) circuits have achieved widespread adoptions for code and data storage applications. Programming the memory cells to a program state involves, for example, injecting hot electrons into the gate dielectric of the floating or select gate of the memory cell to increase the threshold voltage. Erasing the memory involves, for example, Fowler-Nordheim (FN) tunneling which tunnels electrons to the control gate to lower the threshold voltage of the memory cell.

An important aspect of NVM circuits is their performance and reliability, which includes endurance (number of programming or write/erase cycles) and data retention after write/erase cycling. Within the industry, the performance of NVM technology has been characterized extensively. Generally, the NVM circuits should be able to endure over 100 thousand to 1 million programming cycles with data retention exceeding 20 years, even at extreme ambient temperatures.

The present disclosure is directed to a memory cell with improved performance and reliability.

SUMMARY

Embodiments generally relate to semiconductor devices. In one embodiment, a device having a substrate prepared with a memory cell region is disclosed. The memory cell region includes first and second memory cells. Each of the memory cells includes an access transistor and a storage transistor. The access transistor includes first and second source/drain (S/D) regions and the storage transistor includes first and second storage S/D regions. The access and storage transistors are coupled in series and the second S/D regions being a common S/D region. An erase gate is disposed over the common S/D region. A program gate is disposed over the first storage S/D region. Such an arrangement of the memory cell decouples a program channel and an erase channel.

In another embodiment, a method of fabricating a device is presented. The method includes providing a substrate prepared with a memory cell region. First and second memory cells are formed on the memory cell region. The method includes forming an access transistor and a storage transistor. The access transistor includes first and second access source/drain (S/D) regions and the storage transistor includes first and second storage S/D regions. The access and storage transistors are coupled in series and the second S/D regions being a common S/D region. An erase gate is formed over the common S/D region and a program gate is formed over the first storage S/D region. Such an arrangement of the memory cell decouples a program channel and an erase channel.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 5a-j show a cross-sectional views of an embodiment of a process for forming a memory cell pair; and FIGS. 6a-h show a cross-sectional views of another embodiment of a process for forming a memory cell pair.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
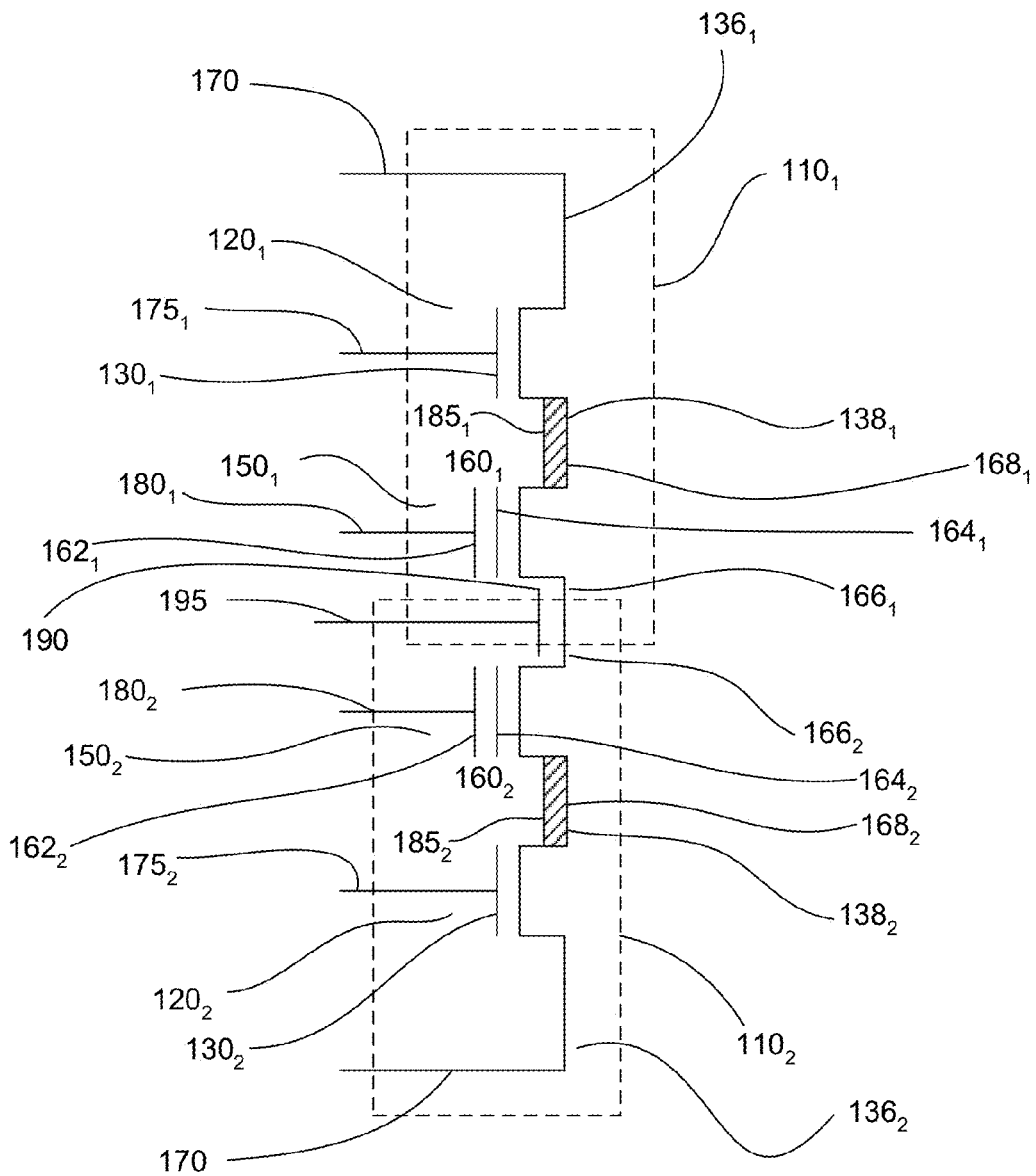
FIG. 1 shows schematic diagram of an embodiment of a memory cell pair.

FIG. 1 shows a schematic diagram of an embodiment of a memory cell pair 100. The memory cell pair includes first and second memory cells $110_1$ and $110_2$. The memory cells, in one embodiment, are NVM cells. Providing other types memory cells may also be useful. In FIG. 1, some reference numerals may include a subscript. The subscript indicates which memory cell of the memory cell pair that the element is associated. For example, a reference numeral with a subscript 1 indicates that the element is associated with the first memory cell of the memory cell pair; a reference numeral with a subscript 2 indicates that the element is associated with the second memory cell of the memory cell pair. In some instances, the description may refer to elements generally without including the subscript.

A memory cell 110 includes a first transistor 120. The first transistor serves as an access transistor of the memory cell. The access transistor has a select gate (SG) 130 with first and second access diffusion or S/D regions 136 and 138. The memory cell also includes a second transistor 150. The second transistor, for example, serves as a storage transistor. The storage transistor has a gate 160 with a storage layer and first and second storage S/D regions 166 and 168. The gate of the storage transistor, in one embodiment, includes first and second storage gates 164 and 162. The second storage gate is disposed over the first storage gate and separated by an intergate dielectric layer. A tunneling dielectric layer separates the substrate from the first storage gate. The first storage gate, for example, is a floating gate (FG) while the second storage gate is a control gate (CG).

In one embodiment, the first and second transistors are coupled in series, with the second diffusion regions being a common S/D region. For example, the second access S/D region of the access transistor is a common S/D region with the second storage S/D region of the storage transistor. An erase gate (EG) 185 is disposed over the common S/D region of the transistors. In one embodiment, the EG contacts the substrate and common S/D region while isolated from the storage layer and access gate by gate sidewall dielectric layers. As for the first storage S/D region, a program gate 190 is disposed over it, separated by a program gate dielectric layer. The program gate, for example, is adjacent to the storage layer and electrically isolated by a dielectric layer. Such arrangement and configuration enable the erase operation and the program operation to be performed on different sides of the memory cell. As such, it decouples the program, erase and read channels of the memory cell. The read channel, for example, is underneath the memory cell.

A bitline (BL) 170 is coupled to the first access S/D region; a select gate line (SGL) 175 is coupled to the select gate. Coupled to the control gate is a control gate line (CGL) 180 while a program gate line (PGL) 195 is coupled to the program gate.

As shown, the first and second memory cells are coupled in series to form a memory cell pair. In one embodiment, memory cells of the memory cell pair are configured as mirror images of each other. For example, the first storage S/D region $166_1$ of the first memory cell is common with the first storage S/D region $166_2$ of the second memory cell. The first access S/D regions $136_1$ and $136_2$ are coupled to a common bitline 170. As such, the memory cells of the memory cell pair share a common program gate. Although only 1 memory cell pair is shown, it is understood that additional memory cell pairs may be provided to form a column of memory cell pairs. Furthermore, multiple columns of memory cells can be configured to form an array of memory cells.

Appropriate voltages may be applied to a memory cell via the BL, CGL, SGL, PGL and SL to perform different memory operations. The different memory operations may include program, read and erase operations. The program channel, in one embodiment, is disposed from the edge of the program gate to the floating gate. In one embodiment, a program operation includes injecting electrons into the floating gate. For example, electrons are injected into the floating gate from the program gate. This increases the gate threshold voltage of the storage transistor. On the other hand, the erase channel, for example, is disposed from the floating gate edge to the erase gate. In one embodiment, an erase operation tunnels electrons to the erase gate from the floating gate. This lowers the gate threshold voltage. The read channel, for example, is disposed below the floating gate. When a bit which has been programmed is read, the read current is low due to the higher gate threshold. For a bit which has been erased, the read current is high due to the lower gate threshold voltage. As such, a programmed bit stores a "0" while an erased bit stores a "1". Providing other configurations of programmed and erased bits may also be useful.

An embodiment of exemplary voltages which are applied to the terminals of the memory cell for different operations are shown in Table 2. In one embodiment, the voltages shown in Table 2 are applied to memory cell for different operations of a n-type memory cell formed in a p-type well. Applying other voltages to the terminals for different operations may also be useful.

tunneling. Additionally, the low coupling ratio of the PG with respect to FG further enhances write efficiency. In some embodiments, programming or write efficiency can additionally be enhanced by modifying the CG voltage during a write operation. A positive CG voltage applied increases the potential of FG gate towards positive side hence, enhancing electron injection from the PG.

Furthermore, by providing separate or decoupled read, program and erase channels, program-induced and erase-induced degradation are separated from each other. Additionally, the read channel is not affected by program-induced and erase-induced degradation. The intergate and tunneling dielectric layers are also not affected by program-induced and erase-induced degradation. Other advantages of separate read, program and erase channels include avoiding the occurrence of soft erases, degradation of mobility and sub-threshold (sub-vt) slope as well as program and erase disturb on unselected cells. This significantly improves endurance and data retention of the memory cells.

Figure 2:
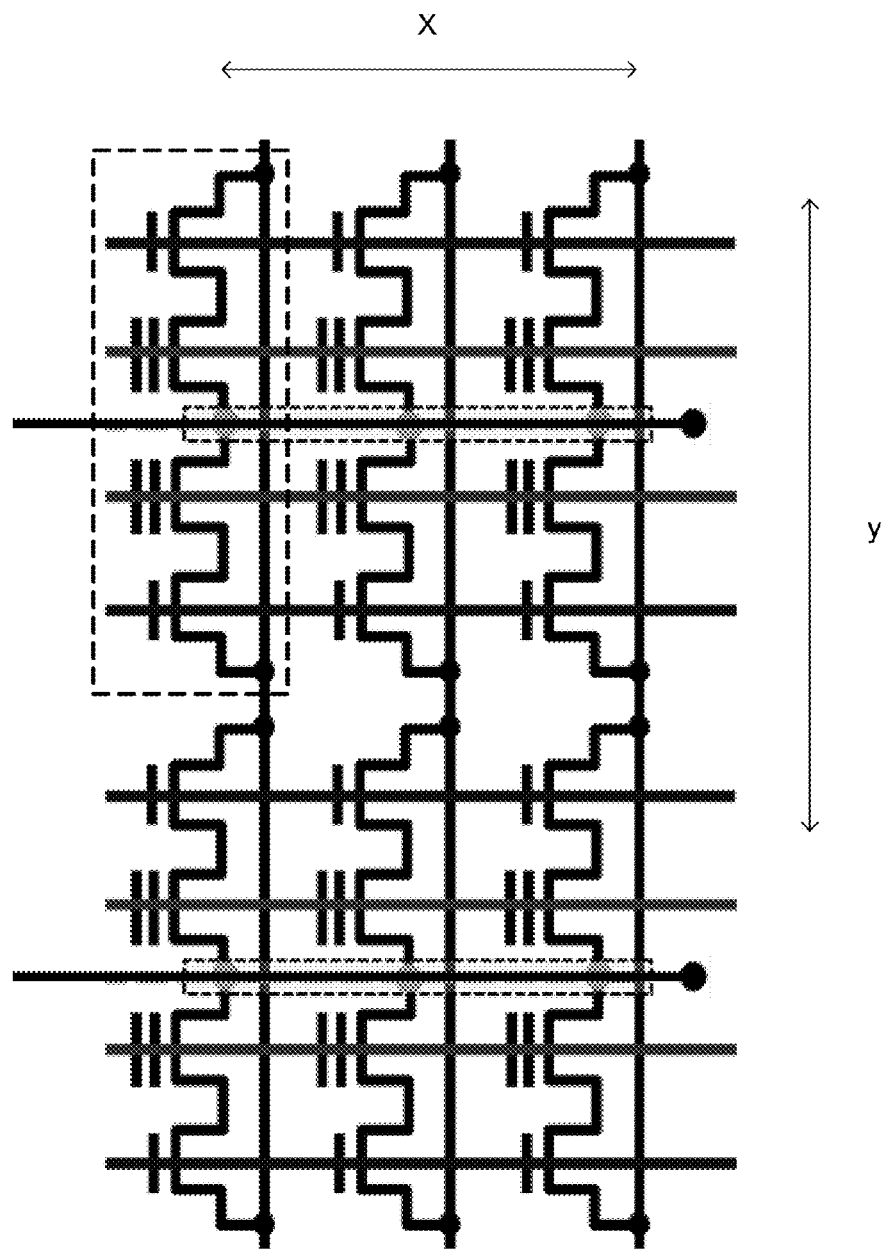
FIG. 2 shows an embodiment of a memory array.

FIG. 2 shows a plurality of memory cell pairs 100 configured to form a memory array 200. The plurality of memory cell pairs of the array are arranged in first (x) and second (y) directions. As shown, the array is shown with 4×3 array. For example, the memory cells are arranged in 3columns, each column having 2 memory cell pairs or 4 rows of memory cells. A row of memory cells has common SGL, CGL, PGL and SL. Adjacent memory cells of a memory cell pair share common PGL and SL.

In other embodiment, other size memory arrays may be provided. The memory array may be separated into sectors. A sector, for example, includes 8 rows and 2,000 columns. An array may include about 62 sectors for a 1 MB memory. Providing other size sectors or other number of sectors may also be useful. In one embodiment, memory cells of a row may be isolated by isolation regions, such as shallow trench isolations (STIs) while memory cells of a column are not isolated from each other. Providing other row and column configurations may also be useful.

In one embodiment, the memory cells of a sector share common CGLs. Sharing of common CGLs advantageously reduce the number of CG decoders needed, thereby reducing complexity and design area of the device. A SGL controls an individual row of cells in the sector. By applying appropriate voltages to the CGLs, SGLs, PGLs and BLs, a bit or multiple bits of the memory sector may be selected for accessing. In some embodiments, a program operation may be applied to a column, a row or a sector. As for an erase operation, it may be applied by a single bit through enabling the select/access gate transistor.

Figure 3A:
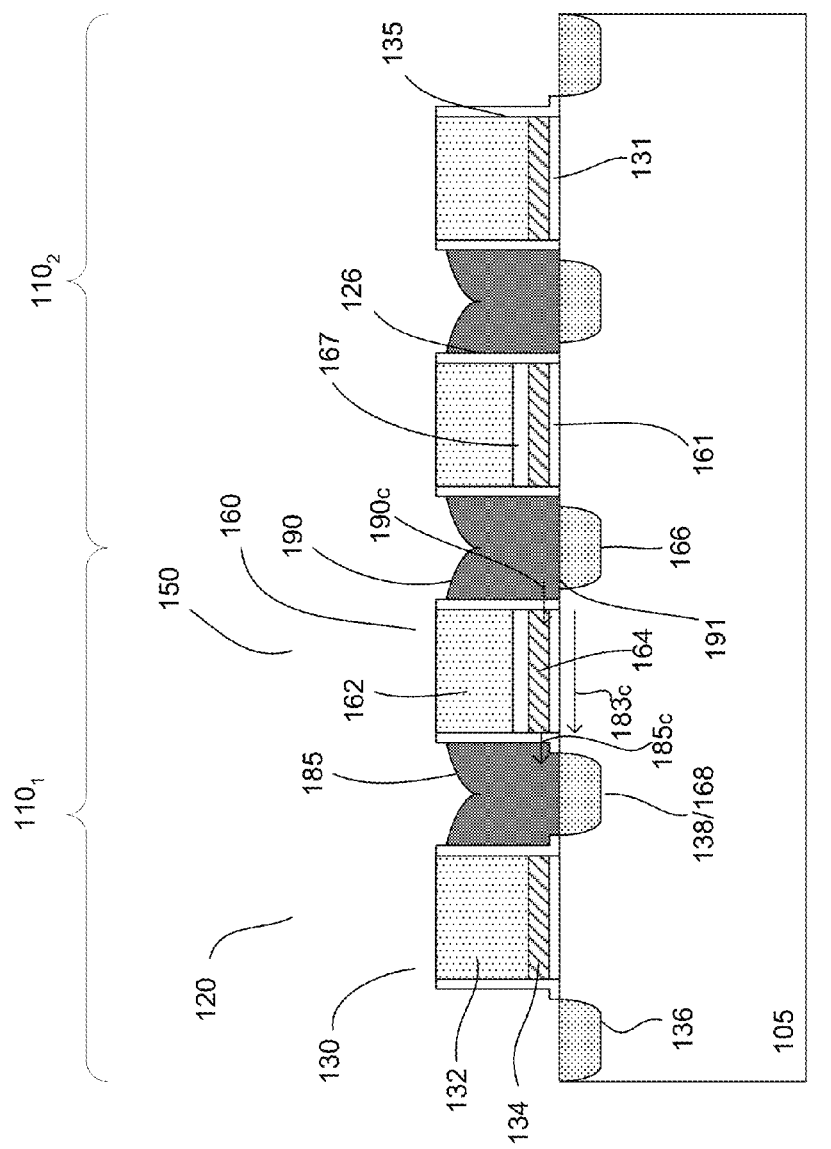
FIGS. 3a-b show cross-sectional views of embodiments of memory cell pairs.
Figure 3B:
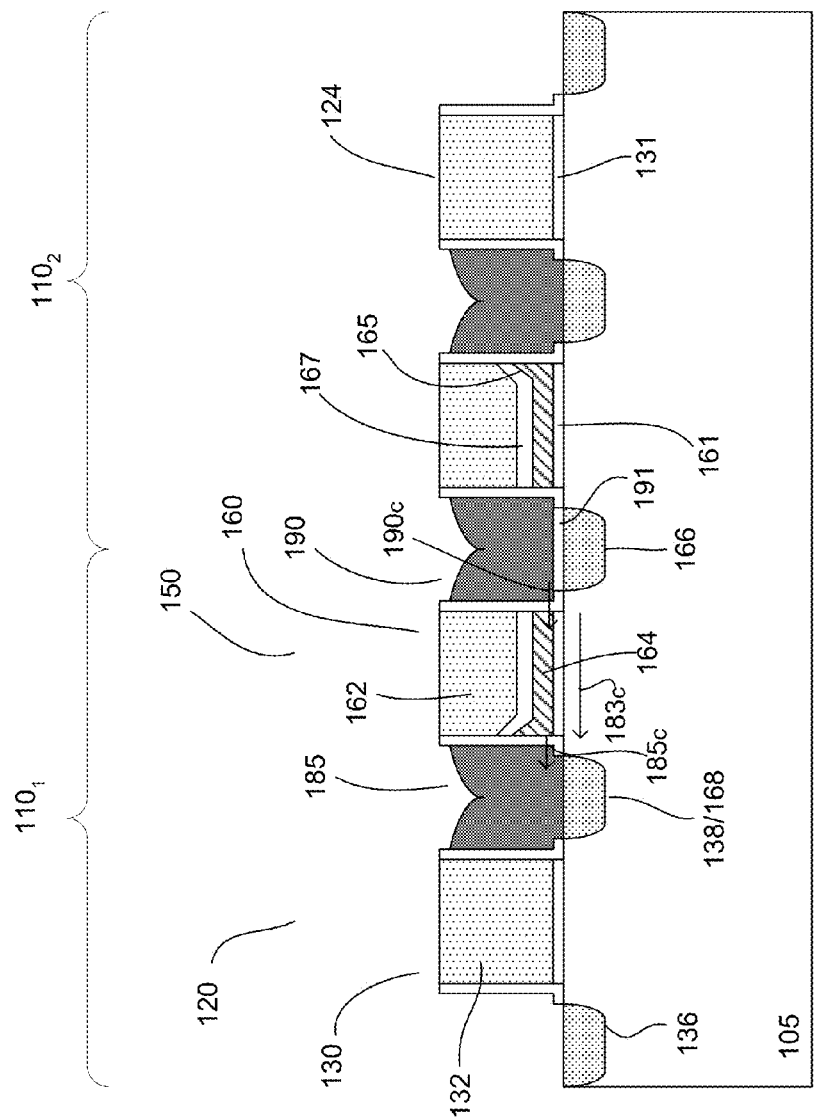

FIGS. 3a-b show cross-sectional views of different embodiments of a device 300. The device includes a substrate

TABLE 2

|  | BL | | PG | | SL | | CG | | SG | |
| --- | --- | --- | --- | --- | --- | --- | --- | --- | --- | --- |
|  | Sel | Unsel | Sel | Unsel | Sel | Unsel | Sel | Unsel | Sel | Unsel |
| Read | Vref | 0 V | 0 V | 0 V | 0 V | 0 V | Vcc | 0 V | Vcc | 0 V |
| Write | 0 V | 0 V | −10 V | 0 V | 0 V | 0 V | *0 V | 0 V | 0 V | 0 V |
| Erase | +5 V | 0 V | 0 V | 0 V | 0 V | 0 V | −6 V | 0 V | +5 V | 0 V |

For example Tunnel oxide ~110 A, IPD O/N/O 50 A/50 A/50 A, EG-FG110A Well is kept ground all the time.
*apply +ve at CG can improve speed As described, the memory cell includes separate write, erase and reading channels. In one embodiment, the SG is used for reading and erasing. For a program or a write operation, the PG tip enhances electron injection to FG by FN 105. The substrate, for example, may be a silicon substrate. The substrate can be lightly doped with p-type dopants. Other types of semiconductor substrates may also be used. For example, the substrate may be silicon germanium or siliconon-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), intermediate voltage (IV) and low voltage (LV) voltage devices.

In one embodiment, the memory cells are NVM memory cells. Providing other types of memory cells may also be useful. As shown, the memory cell region includes first and second memory cells $110_1$ and $110_2$. The first and second memory cells may be a memory cell pair 100 of the device. For example, the memory cell pair may be adjacent memory cells of a column of memory cells. It is understood that the memory cell region includes numerous memory cells arranged in columns and rows to form a memory array. The array may be configured to have sub-arrays or sectors. Shallow trench isolation (STI) may be used to isolate a column of memory cells from other columns.

The array region may include a doped well (not shown) with dopants of a second polarity type. The doped well may be intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ is about 0V. The second polarity type doped well serves as a well for a first polarity type device. In one embodiment, the second polarity type includes p-type. For example, the p-type doped well serves as a well for a n-type memory cell. Providing a n-type doped well may also be useful. P-type dopants can include boron (B), aluminum (Al), indium (In) or a combination thereof while n-type dopants can include phosphorus (P), arsenic (As), antimony (Sb) or a combination thereof.

The substrate includes isolation regions (not shown) to isolate active device regions from other active device regions, as required. The isolation regions, for example, are shallow trench isolation (STI) regions. Other types of isolation regions are also useful. For example, isolation regions may be employed to isolate adjacent memory cells of a row.

In one embodiment, a memory cell includes first and second transistors 120 and 150. The second transistor, for example, serves as a storage transistor. The storage transistor has a gate 160 with a storage layer and first and second storage S/D regions 166 and 168. The storage S/D regions include first polarity type dopants. Providing additional region or regions such as halo or LDD S/D regions may also be useful. The first polarity type dopants form a first type memory cell. For example, n-type S/D regions form a n-type memory cell.

The gate of the storage transistor, in one embodiment, includes first and second storage gate electrodes 164 and 162. The second storage gate electrode is disposed over the first storage gate electrode. The storage gate electrodes may include polysilicon. The storage gate electrodes may be a n-type doped gate electrodes. The dopant concentration of the storage gate electrodes may be about 1E14 to 5E15 cm$^{-2}$ with implant depth near poly surface. Doping the storage gate electrodes, for example, reduces resistivity and improves the performance of the memory cell. The storage gate electrodes may be doped with other types of dopants. Other types of gate electrode materials, such as metals to form metal gates, may also be useful. The storage gate electrodes need not be formed from the same material. For example, the first or FG gate electrode may include a different material than the second or CG electrode. The FG gate electrode, for example, may be about 10 to 80 nm thick whereas the CG gate electrode, for example, may be about 50 to 150 nm thick. Other thickness dimensions for the FG and CG may also be useful. In one embodiment, the FG gate electrode may include nanocrystals. For example, the FG gate electrode may include embedded Si/Ge/Si—Ge nanocrystals in dielectrics.

The FG and CG are separated by an intergate dielectric layer 167. The intergate dielectric layer may include silicon oxide. Other types of intergate dielectric material, such as silicon oxynitride, $Si_3N_4$, high-k dielectrics may also be useful. In some embodiments, the intergate dielectric layer may include a composite intergate dielectric layer having multiple dielectric layers. For example, the intergate dielectric layer may include an oxide/nitride/oxide (ONO) dielectric stack. The intergate dielectric layer serves as a blocking layer to prevent the escape of electrons from the FG. The intergate dielectric material, for example, may be about 80 to 150 nm thick. In one embodiment, the intergate dielectric material is about 100 nm thick. Other thicknesses for the intergate dielectric layer may also be useful.

A storage gate dielectric layer 161 separates the substrate from the first storage gate. The storage gate dielectric layer, for example, serves as a tunneling dielectric layer. In one embodiment, the storage gate dielectric layer is formed from thermal silicon oxide. In other embodiments, the storage gate dielectric layer may include other types of gate dielectric material, such as high-k materials. The gate dielectric layer may be a low voltage (LV) gate dielectric layer. For example, the tunneling gate dielectric layer is employed for LV devices. The thickness of the storage gate dielectric layer may be about 20-80 Å. Providing a storage gate dielectric layer of other thicknesses or other types of storage gate dielectric layers may also be useful.

As for the first transistor, it may serve as an access transistor of the memory cell. The access transistor includes a select gate 130 disposed on the substrate. First and second access S/D regions 136 and 138 are located in the substrate adjacent to sides of the select gate. In one embodiment, the access S/D regions include first polarity type dopants. The doping concentration of the access S/D regions may be about 1E14 to 5E15 cm$^{-2}$.

The select gate includes a select gate electrode 135. In one embodiment, select gate electrode may include polysilicon. The select gate electrode may be an n-type doped gate electrode. The dopant concentration of the select gate electrode, for example, may be about 1E14 to 5E15 cm$^{-2}$. The select gate electrode doped with other types of dopants and other dopant concentrations may also be useful. Other types of gate electrode materials, such as metals to form metal gates, may also be useful. The thickness of the select gate electrode may be about 80 to 150 nm. In one embodiment, the select gate electrode is about 100 nm thick. Providing a select gate electrode having other thicknesses may also be useful.

The select gate electrode may include a composite select gate electrode with a plurality of select gate electrode layers. In one embodiment, the composite select gate electrode includes first and second select gate electrodes 134 and 132, with the second select gate electrode over the first select gate electrode. The select gate electrodes, for example, directly contact each other. In one embodiment, the first and second select gate electrodes are the same layers as the FG and CG electrodes. For example, the first and second select gate electrodes have the same material and thickness as the FG and CG electrodes. Other configurations of the gate electrode layers may also be useful.

An access or select gate dielectric layer 131 separates the substrate from the access gate electrode. The access gate dielectric layer, for example, may be the same as the storage gate dielectric layer. For example, the access gate dielectric layer may be of the same material and have the same thickness as the storage gate dielectric layer. Other types of access gate dielectric layers may also be useful.

The gates may include sidewall spacers 126 on gate sidewalls. In one embodiment, the sidewall spacers may be L-shaped sidewall spacers. The sidewall spacers may include a dielectric material, such as silicon oxide. Other types of spacer materials, such as $Si_3N_4$, may also be useful. In some embodiments, the sidewall spacers may be a composite spacer which multiple layers of dielectric materials. The thickness of the spacers may be about 8 to 15 nm. Providing spacers having other thicknesses may also be useful.

In one embodiment, the first and second transistors are coupled in series, with the second diffusion regions being a common S/D region. For example, the second access S/D region of the access transistor is a common S/D region with the second storage S/D region of the storage transistor. This results in the memory cells of the memory cell pair configured as mirror images of each other. For example, the control gates of the memory cells are adjacent to each other. Other configurations of the memory cells of the memory cell pair may also be useful. For example, the access gates of the memory cells of the memory cell pair may be adjacent to each other.

An erase gate 185 is disposed over the common S/D region of the transistors. In one embodiment, the EG contacts the substrate and common S/D region while isolated from the storage and access gate by sidewall spacers on the gates. As for the first storage S/D region, a program gate 190 is disposed over it, separated by a program gate dielectric layer 191. The program gate dielectric layer, for example, includes silicon oxide. The thickness of the program gate dielectric layer may be about 5 to 10 nm. Other types of dielectric materials, such as $Si_3N_4$, or thicknesses may also be useful for the program gate dielectric layer. In one embodiment, the program gate dielectric layer may be the same as the gate dielectric layer. The program gate, for example, is adjacent to the storage gates of the memory cell pair and electrically isolated by the sidewall spacers on the sides of the storage gates.

The EG and PG may include a gate electrode material. In one embodiment, the EG and PG includes polysilicon. Other types of gate electrode materials may also be useful. It is understood that the EG and PG need not be of the same material.

A dielectric layer (not shown) is provided over the substrate, covering the memory cells. The dielectric layer, for example, serves as an interlevel dielectric (ILD) layer. The dielectric layer, for example, may be TEOS. Other types of dielectric materials, such as low-k dielectric materials or high density plasma oxides may also be used.

Contacts are provided in the dielectric layer for coupling to the different terminals of the memory cells. For example, bitline contacts are coupled to the first access S/D regions of the access transistor, control gate contacts are coupled to the control gates of the storage transistors, select gate contacts are coupled to the select gates of the access transistor, and program gate contacts is coupled to the program gate, which is common to both memory cells of the memory cell pair. BLs are coupled to the bitline contacts, CGLs are coupled to the CG contacts, SGLs are coupled to the SG contacts and a PGL is coupled to the program gate (PG) contact.

In an alternative embodiment, as shown in FIG. 3b, the floating gates are provided with a sharp FG tip 165. The sharp FG tip is disposed on the side of the floating gate adjacent to the erase gate. Providing a sharp FG tip enhances erase efficiency by allowing faster electron injection to the erase gate.

Figure 4:
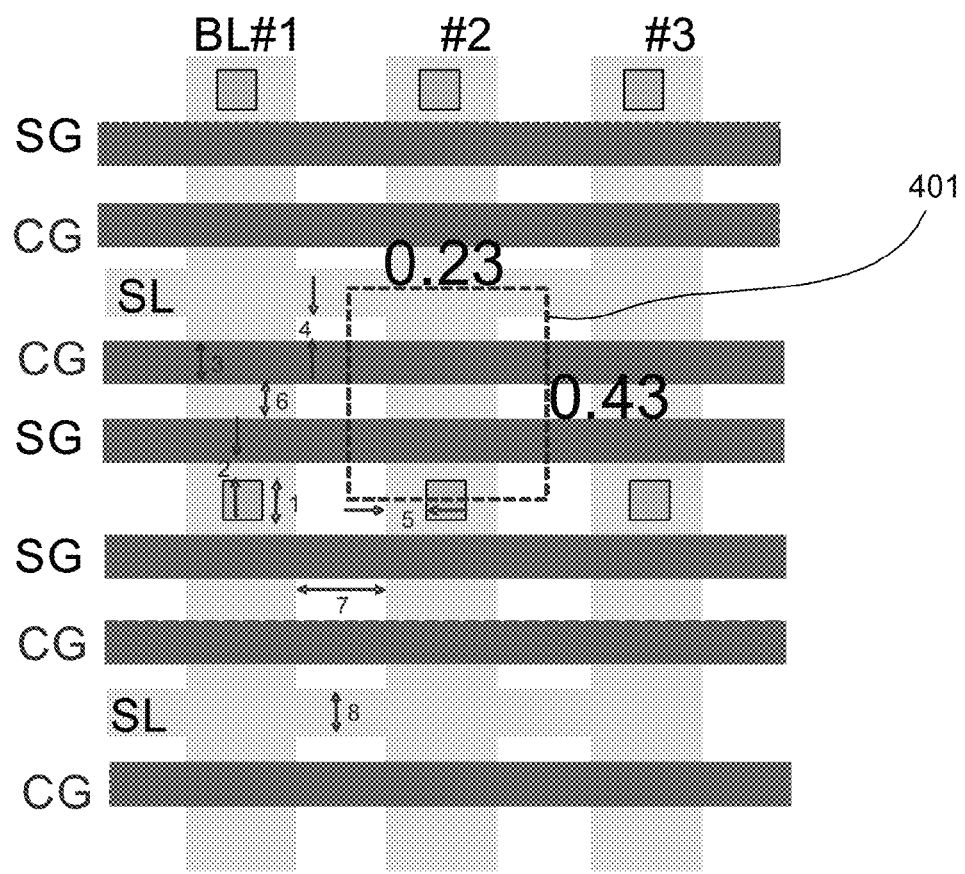
FIG. 4 shows a layout of an embodiment of a memory cell.

FIG. 4 shows an embodiment of a layout of a memory array 400. Referring to FIG. 4, a memory cell 401 having a cell size of about 0.0989 $\mu m^2$ is shown. For example, the length of the cell may be about 0.23 μm and the width of the cell may be about 0.43 μm. In one embodiment, the cell size is about 0.23 $F^2$, where F is the feature size. Providing other cell size dimensions may also be useful, depending on the node or generation of the technology.

Figure 5A:
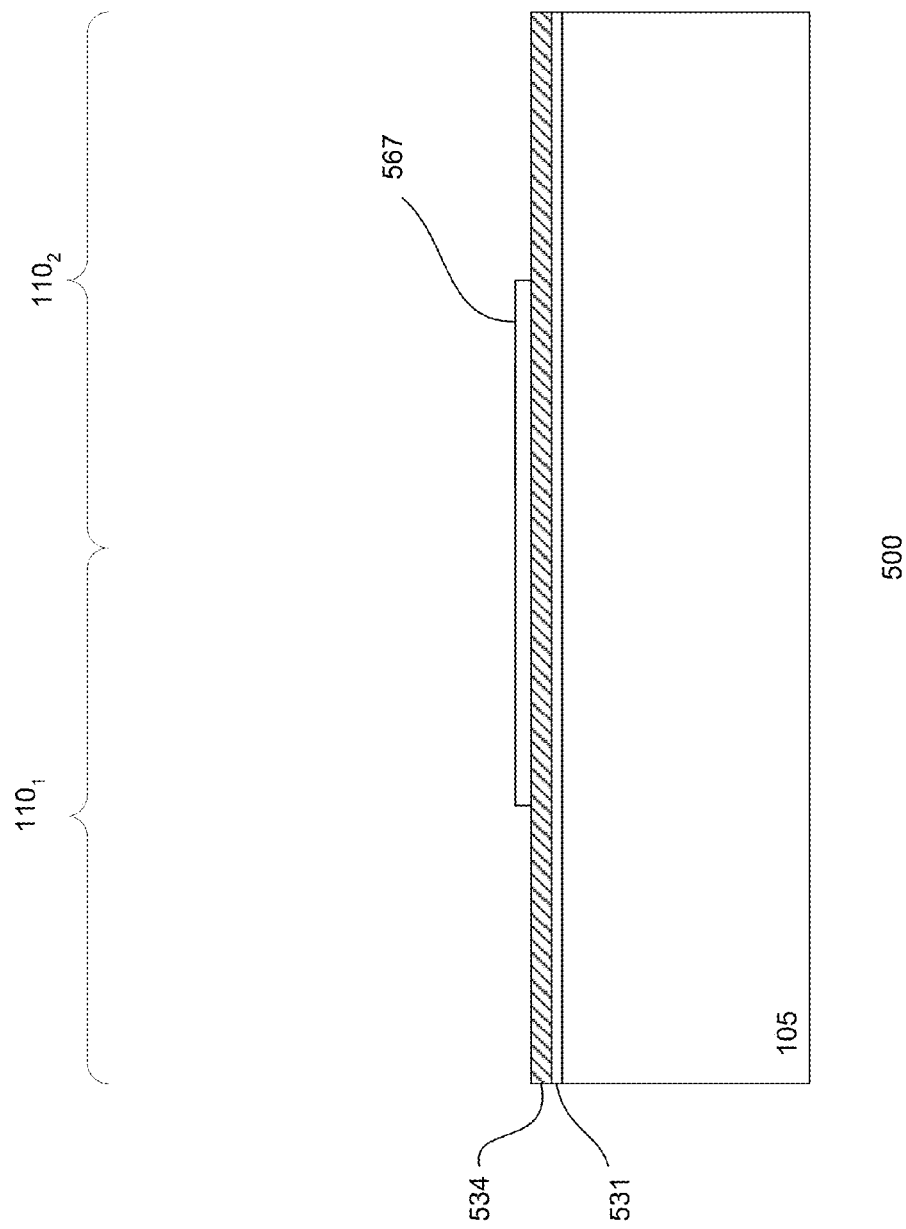

FIGS. 5a-i show cross-sectional views of an embodiment of a process for forming a device or IC 500. Referring to FIG. 5a, a substrate 105 is provided. The substrate can be a silicon substrate. For example, the substrate can be a silicon substrate lightly doped with p-type dopants. Other types of semiconductor substrates, such as silicon germanium or silicon-on-insulator (SOI) as well as intrinsic or doped with other types of dopants or dopant concentrations, are also useful.

The substrate, in one embodiment, is prepared with a memory region for memory cells of the device. The memory region can be referred to as an array region. Memory cells which are formed in the array region may include NVM memory cells. Providing a substrate prepared with other types of regions (not shown) may also be useful. For example, the substrate may include a logic region for support circuitry. The substrate may also include regions for other types of circuitry, depending on the type of device or IC. For example, the logic region may include sub-regions for HV, IV and LV devices.

The array region may include a doped well (not shown) with dopants of a second polarity type. The doped wells may be intermediately or heavily doped. The doped well may be a common doped well in the array region for the memory cells. The second polarity type can be n-type or p-type, depending on the memory cell type. The second polarity type well is used for first polarity type memory cells. For example, a p-type well is used for n-type memory cells while a n-type well is used for p-type memory cells. P-type dopants can include boron (B), aluminum (Al), indium (In) or a combination thereof while n-type dopants can include phosphorus (P), arsenic (As), antimony (Sb) or a combination thereof Generally, the IC includes regions with both first and second type wells. To form the doped wells for different regions, ion implantation techniques, such as implantation with a mask, can be used. The first and second type wells can be formed in separate processes. Other techniques for forming the doped wells may also be useful.

The substrate can be prepared with isolation regions (not shown), for example, to separate the different active regions from each other and other active device regions. The isolation regions may be used to separate adjacent memory cells of a row. In one embodiment, the isolation regions are STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

The substrate may be implanted with dopants to define the initial gate threshold voltage ($V_T$). For example, multiple threshold adjust implants may be performed for different types of devices.

As shown, the substrate is prepared with a primary gate dielectric layer 531. In one embodiment, the gate dielectric layer may be a silicon oxide layer. The silicon oxide layer may be formed by thermal oxidation. The thermal oxidation may either be dry or wet oxidation at a temperature of about 800 to 1100° C. The thickness of the primary gate dielectric layer may be about 20 to 80 Å. Other thicknesses may also be useful. In some embodiments, the gate dielectric layer may include other types of materials, for example, such as silicon oxynitride or high-k materials. The gate dielectric layer may be formed using various techniques, such as thermal oxidation or chemical vapor deposition (CVD).

A first gate electrode layer 534 is deposited on the primary gate dielectric layer. The first gate electrode layer, in one embodiment, may be polysilicon. The gate electrode layer can be formed as an amorphous or non-amorphous layer. In one embodiment, the gate electrode is doped, for example, with first polarity type dopants. Various techniques may be employed to dope the gate electrode, for example, insitu doping or ion implantation. Providing an undoped gate electrode layer may also be useful. Other types of gate electrode materials are also useful. For example, Si—Ge or Ge may be used as the first gate electrode material. The thickness of the first gate electrode layer may be about 10 to 80 nm. Other thicknesses are also useful. To form the first gate electrode layer, techniques, such as CVD, can be used. Other techniques are also useful.

An intergate dielectric layer 567 is formed on the first gate electrode layer. In one embodiment, the intergate dielectric layer includes silicon oxide. In other embodiments, the intergate dielectric layer includes a dielectric stack. For example, the intergate dielectric layer includes multiple dielectric layers. The intergate dielectric layer, in one embodiment, includes an ONO stack. The intergate dielectric layer may be formed by thermal oxidation or CVD. Other types of dielectric layers or techniques for forming the intergate dielectric layer may also be useful. The thickness of the intergate dielectric layer may be about 100 nm. Other thicknesses may also be useful.

As shown, the intergate dielectric layer is patterned, removing it from regions of the substrate where the access gates of the memory cells are formed. To pattern the intergate dielectric layer, a soft mask, such as photoresist, may be employed as an etch mask. The soft mask is patterned to expose portions of the intergate dielectric layer which are to be removed. To improve lithographic resolution, an anti-reflective coating (ARC) may be provided below the soft mask. The exposed portions of the intergate dielectric layer are removed by an etch. For example, a dry etch or a wet etch may be used.

In FIG. 5b, a second gate electrode layer 532 is formed on the substrate, covering the first electrode layer and intergate dielectric layers. The second gate electrode layer, in one embodiment, includes polysilicon. The second gate electrode layer can be formed as an amorphous or non-amorphous layer. In one embodiment, the second gate electrode layer is doped, for example, with first polarity type dopants. Various techniques may be employed to dope the gate electrode, for example, insitu doping or ion implantation. Providing an undoped gate electrode layer may also be useful. Other types of gate electrode materials are also useful. For example, Si—Ge or Ge may be used as the second gate electrode material. The thickness of the second gate electrode layer may be about 50 to about 150 nm. Other thicknesses are also useful. To form the second gate electrode layer, techniques, such as CVD, can be used. Other techniques are also useful.

Figure 5C:
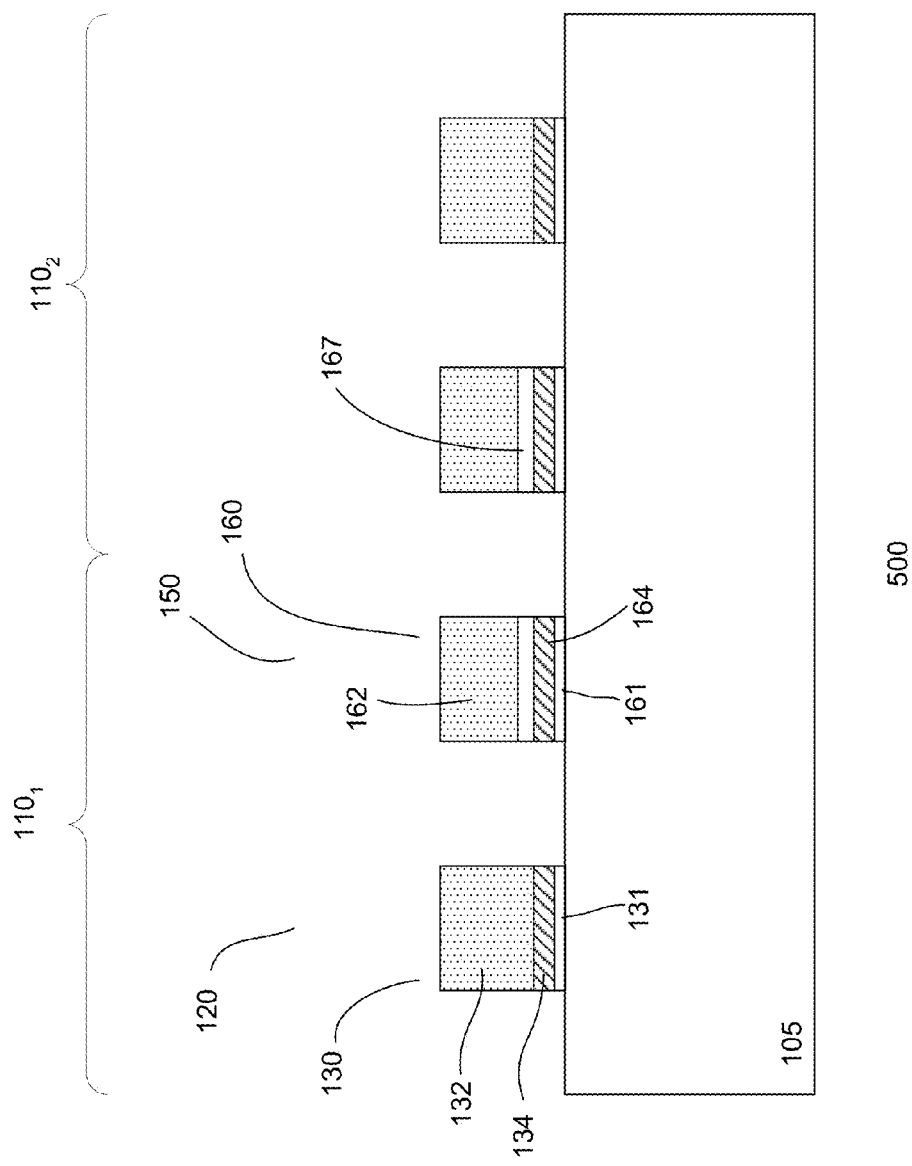

Referring to FIG. 5c, the various gate layers are patterned to form access and storage gates 130 and 160 of the memory cells. The access gate includes an access gate electrode which includes a second access gate electrode layer 132 over and in contact with a first access gate electrode layer 134. The access gate electrode is disposed over an access gate dielectric layer 131. The first and second access gate electrode layer corresponds respectively to the first and second gate electrode layers while the access gate dielectric layer corresponds to the gate dielectric layer. As for the storage gate, it includes a CG 162 over a FG 164. The CG and FG are separated by an intergate dielectric layer 167. The storage gate is disposed over a storage gate dielectric layer 161. The CG and FG correspond to the second and first gate electrode layers while the storage gate dielectric layer corresponds to the gate dielectric layer. The gates, for example, may be gate conductors or lines which extend the length of a row of memory cells.

To pattern the gate layers, a patterned soft mask, such as photoresist, may be employed. The soft mask is patterned to expose portions of the gate layers. For example the mask contains the pattern of the storage gate electrodes. To improve lithographic resolution, an ARC may be provided below the soft mask. An etch is performed to remove the exposed portions of the gate layers to form the gate electrodes. In one embodiment, the etch includes an anisotropic etch, such as a reactive ion etch (RIE). Other types of etch processes may also be used to form the gates.

Figure 5D:
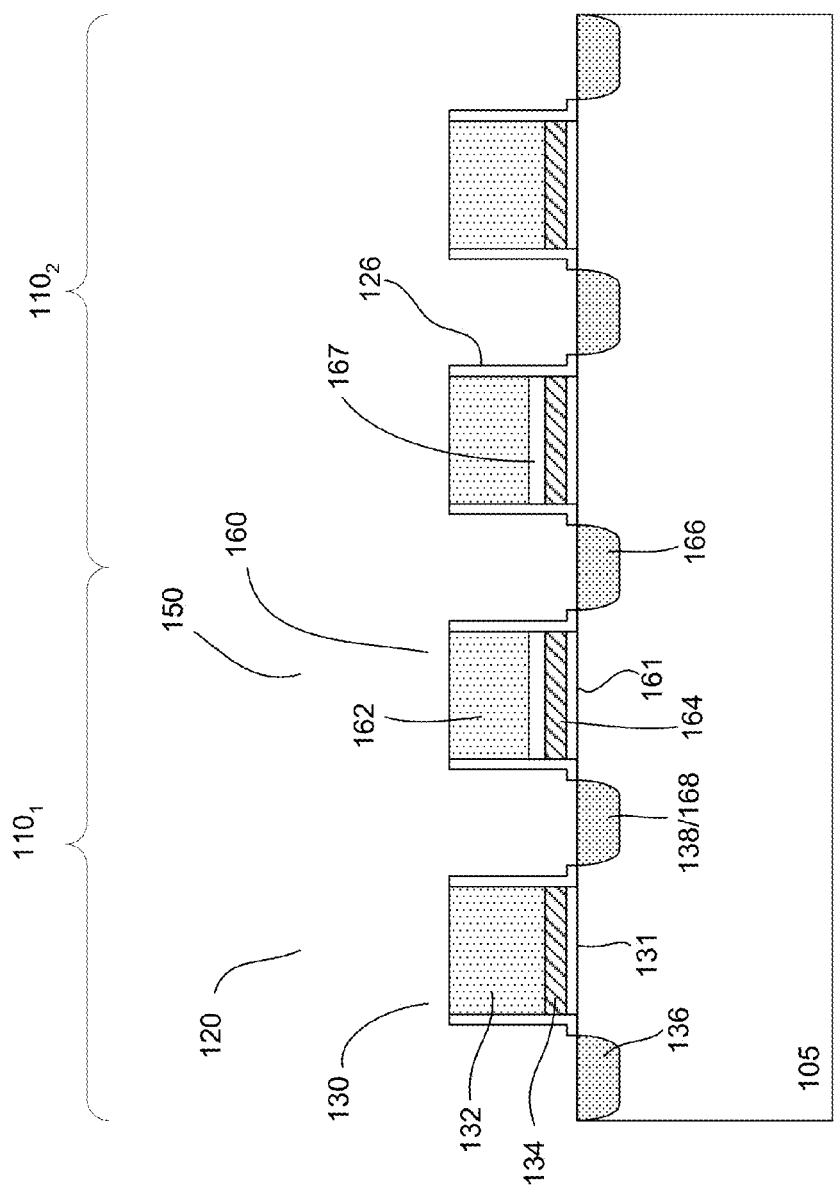

The process continues by removing the softmask. The softmask, for example, may be removed by ashing. In FIG. 5d, L-shaped spacers 126 are formed on sidewalls of the gates. The spacers, for example, may be formed by depositing a spacer dielectric layer over the substrate and patterned to form the L-shaped spacers. After forming the spacers, S/D regions of the transistors are formed. In one embodiment, first polarity dopants are implanted into the substrate to form S/D diffusion regions of the transistors. The implant, for example, is a self-aligned implant. The implant forms first and second access S/D regions 136 and 138 and first and second storage S/D regions 166 and 168, with the second access S/D region and second storage S/D region of a memory cell configured as a second common S/D region 138/168 while first storage S/D regions of adjacent memory cells are configured as a first common S/D region 166.

The mask layer is removed after forming the S/D regions. For example, the mask layer may be removed by ashing. Other techniques for removing the mask layer may also be useful.

Figure 5E:
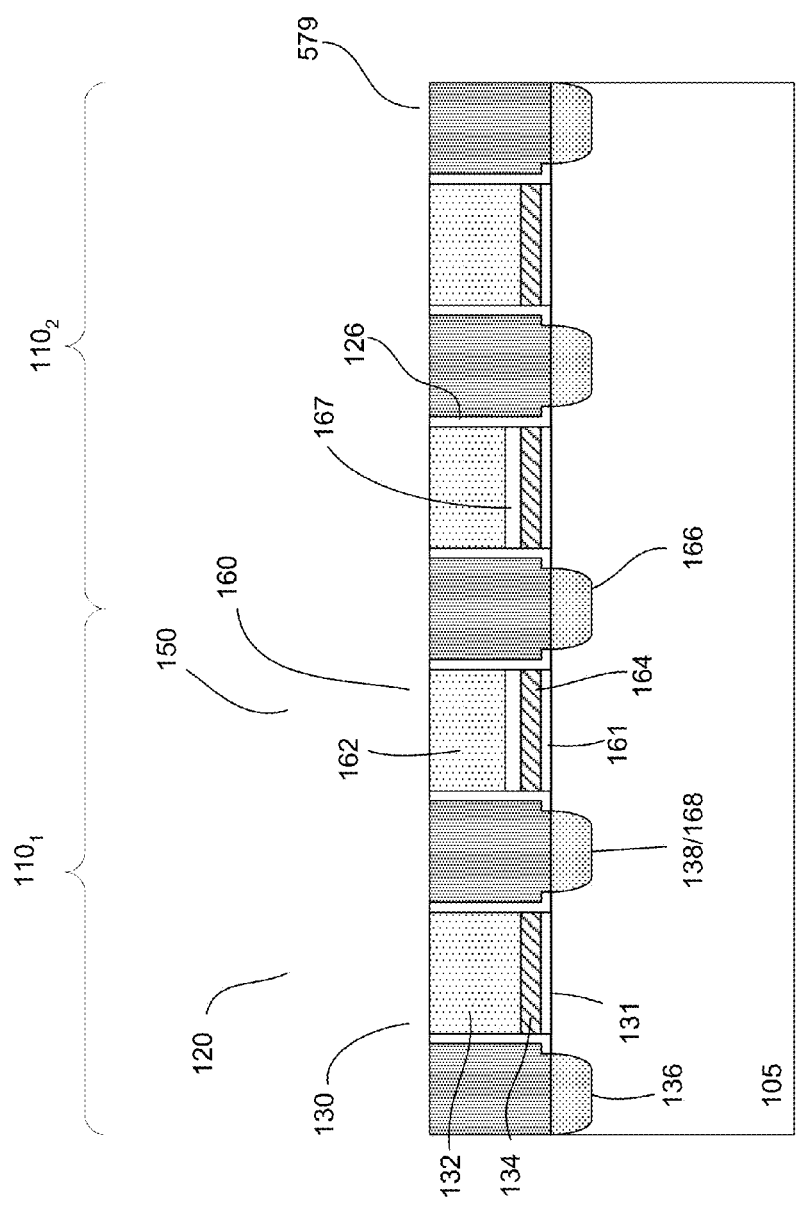

Referring to FIG. 5e, a fill layer 579 is deposited over the substrate, filling the gaps between the gates. The fill layer should include a fill material which can be selectively removed vis-à-vis the gate sidewall spacers as well as the substrate and gate materials. In one embodiment, the fill layer includes a dielectric material. The fill material, in one embodiment, includes silicon nitride. Other types of fill materials may also be useful. Excess fill material is removed by a planarizing process. The planarizing process produces a planar top surface between the fill material and the top of the gates. In one embodiment, the planarizing process includes a chemical mechanical polish (CMP). Other types of planarizing processes, such as electro-CMP (eCMP), may also be useful.

Figure 5F:
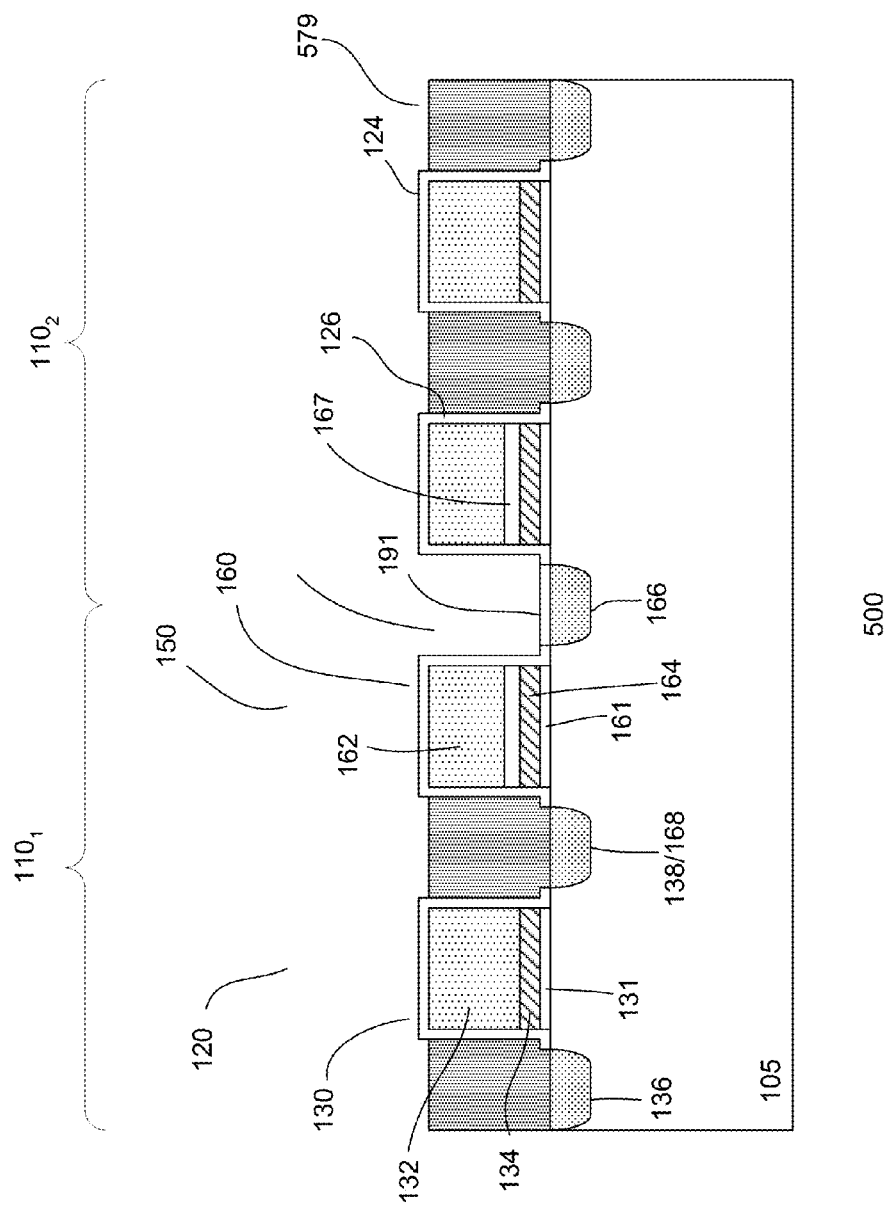

In FIG. 5f, the fill material between the storage gates is removed to expose the first common S/D region. A mask (not shown) may be employed to facilitate removing the fill material between the storage gates. For example, a mask may protect the substrate except for the fill material between the storage gates. An etch may then remove the exposed fill material. The etch, for example, selectively removes the fill material. For example, the etch removes the fill material selective to the sidewall, gate and substrate materials. In one embodiment, the etch may be an anisotropic etch, such as RIE.

The process continues by removing the mask. A dielectric layer 191 is formed on the exposed substrate over the first common S/D region. The dielectric layer over the first common S/D serves as a program gate dielectric layer. In one embodiment, the dielectric layer includes silicon oxide. The dielectric layer may be formed by thermal oxidation. The thermal oxidation may either be dry or wet oxidation at a temperature of about 800-1100° C. The thickness of the proagram gate dielectric layer may be about 5 to 10 nm. Other thicknesses may also be useful. In some embodiments, the dielectric layer may include other types of materials, for example, such as silicon oxynitride or high-k materials. The gate dielectric layer may be formed using various techniques, such as thermal oxidation or chemical vapor deposition (CVD). The process of forming the program gate dielectric layer also forms a gate stack dielectric layer 124 on the top of the gates.

Figure 5G:
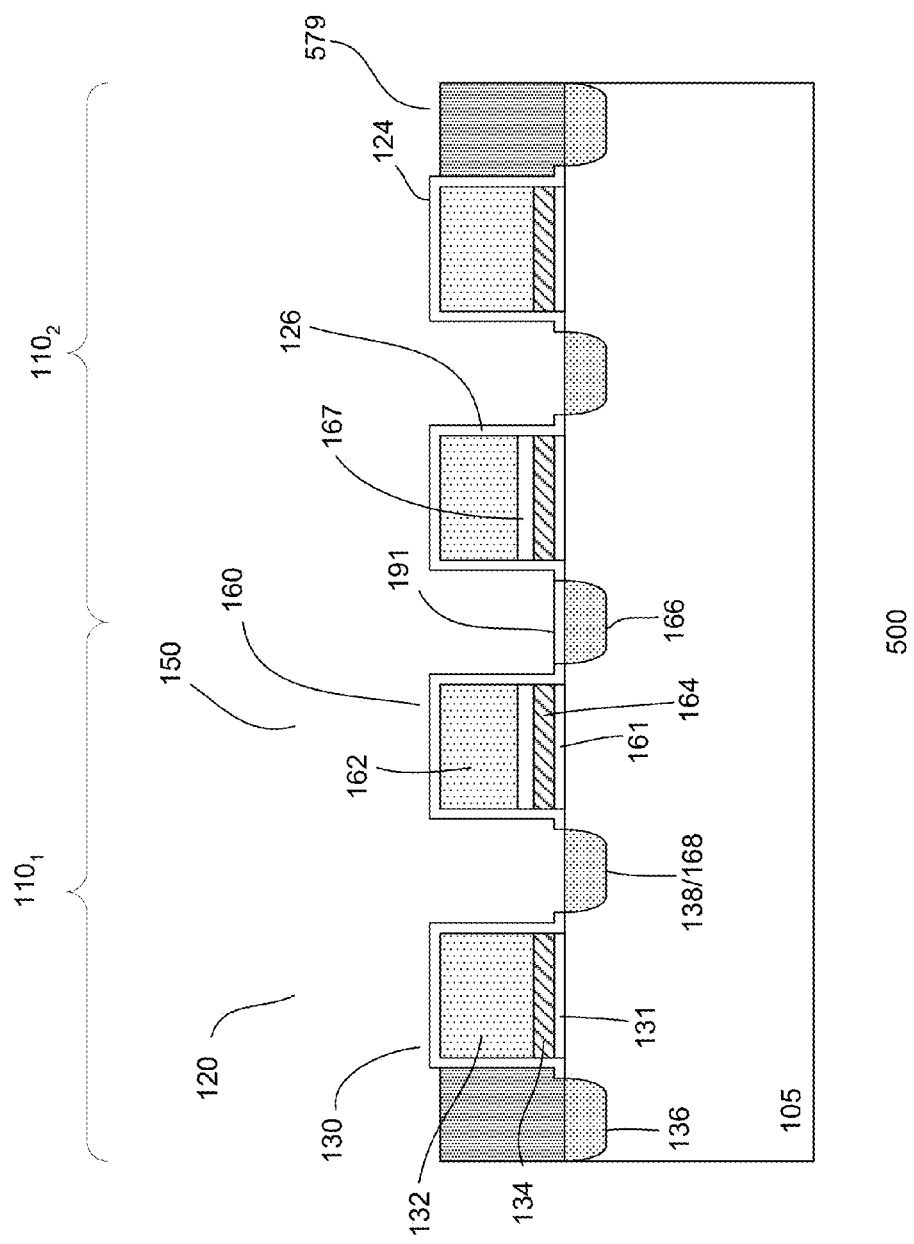

As shown in FIG. 5g, the fill material between the access and storage gates is removed to expose the second common S/D regions 138/168. In one embodiment, only the fill material above the second common S/D regions is removed. A mask may be used to protect the substrate. The mask includes openings to expose the fill material over the second common S/D regions.

An etch is performed to remove the exposed fill material. The etch, for example, may be similar to that used to expose the first common S/D region. The mask may be removed after exposing the second common S/D region.

Figure 5H:
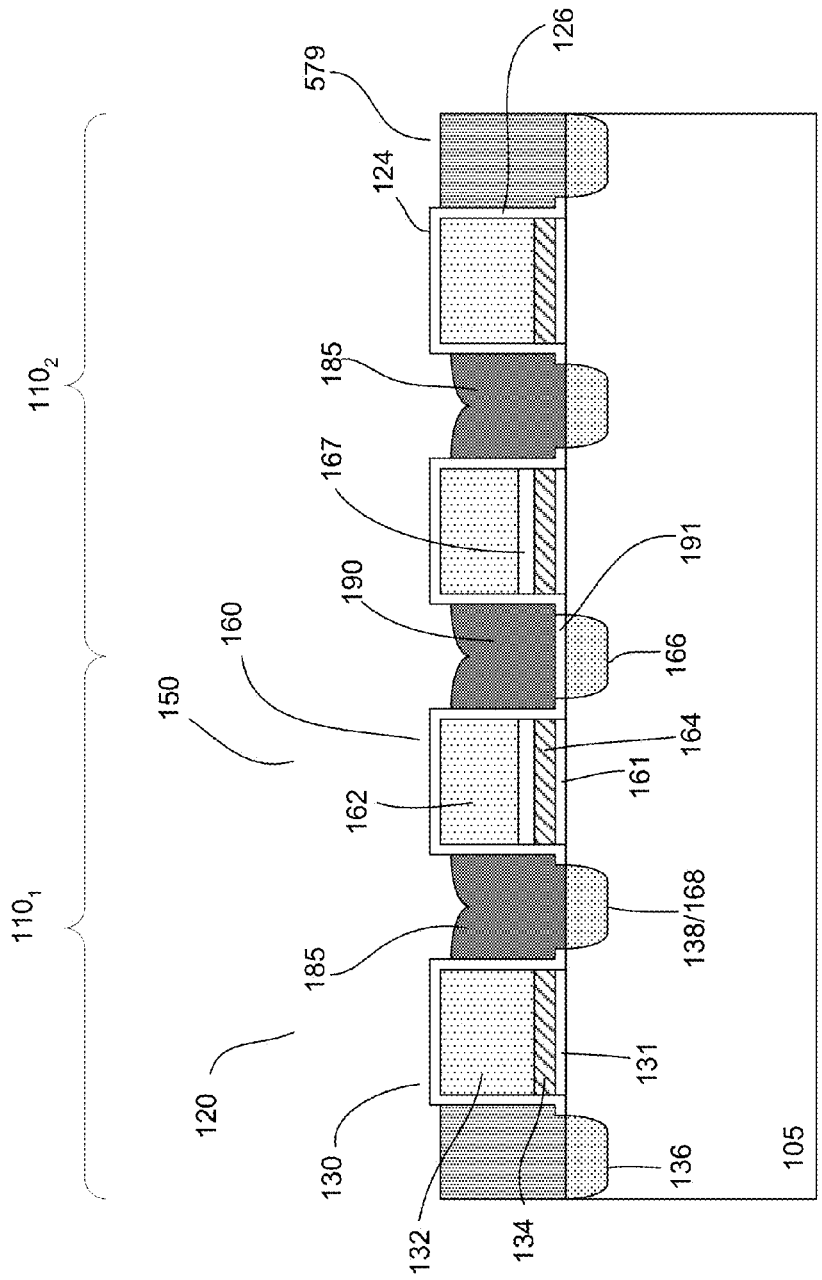

Referring to FIG. 5h, a third gate electrode layer is formed over the substrate, filling the openings over the first and second common S/D regions. Excess third gate electrode layer may cover the gates and fill material. The third gate electrode layer, in one embodiment, includes polysilicon. The third gate electrode layer can be formed as an amorphous or non-amorphous layer. In one embodiment, the third gate electrode is doped, for example, with first polarity type dopants. Various techniques may be employed to dope the gate electrode, for example, insitu doping or ion implantation. In one embodiment, the third gate electrode is insitu doped with first polarity type dopants. Providing an undoped gate electrode layer may also be useful. Other types of gate electrode materials are also useful. For example, Si—Ge or Ge may be used as the gate electrode material.

Excess third gate electrode material over the gate and fill material is removed, leaving gates 185 and 190 in the openings over the first and second common S/D regions. Removing the excess third gate electrode material, in one embodiment, is achieved using an etch back process. For example, the etch back includes a dry etch. Other techniques, such as CMP, may also be used. The gate over the first common S/D region serves as the program gate while the gates over the second common S/D region serves as erase gates.

Figure 5I:
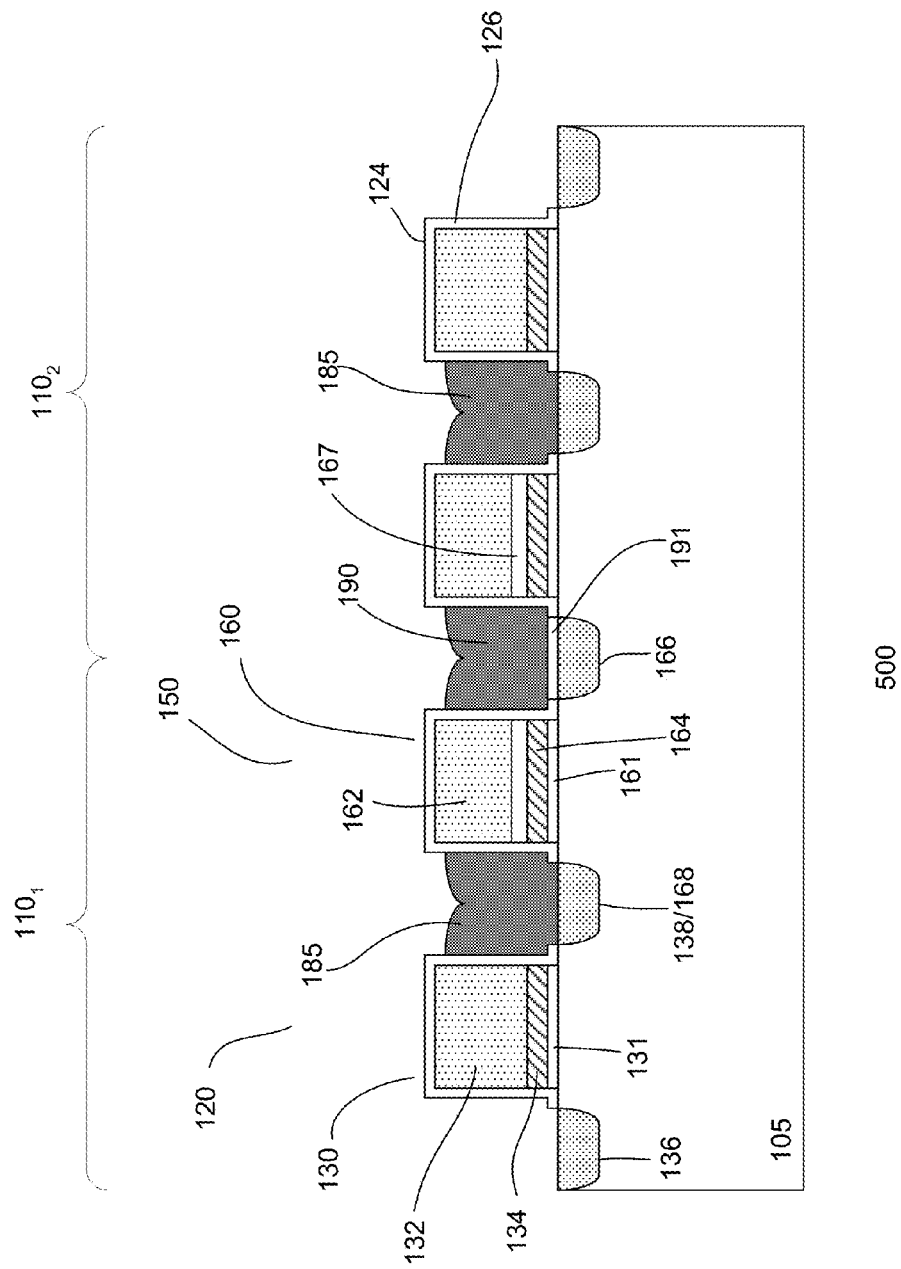

The remaining fill material over the first access S/D regions is removed, as shown in FIG. 5i. Removal of the remaining fill material exposes the first access S/D regions. In one embodiment, the remaining fill material is removed by a etch. The etch, for example, includes a RIE. The dielectric layers on the top surface of the access and storage transistors are removed, as shown in FIG. 5j.

Additional processing can include forming salicide contacts, ILD layer, contacts, and one or more interconnect levels which contain bitlines, PGLs, CGLs SGLs, SL, as well as final passivation, dicing, assembly and packaging. Other processes are also useful. For example, other components, such as LV, IV, HV and I/O devices can be formed prior to forming the interconnections. The memory cells can be formed as a memory device or embedded into a part of ICs. For example, the memory cells can also be integrated with CMOS processing.

Figure 6A:
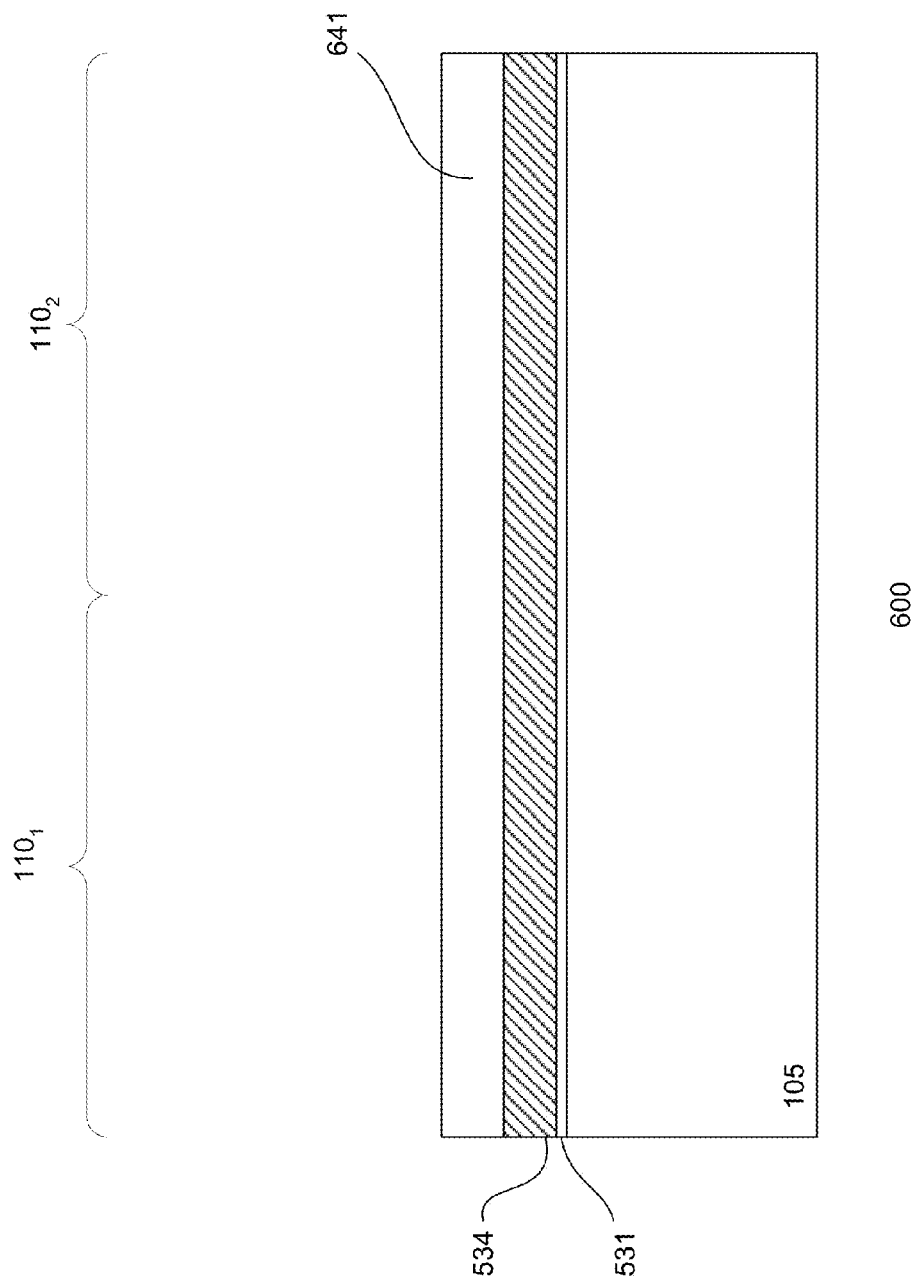

FIGS. 6a-j show cross-sectional views of another embodiment of a process for forming a device or IC 600. Referring to FIG. 6a, a substrate 105 is provided. The substrate is similar to the substrate of FIG. 5a. For example, the substrate includes first and second memory cell regions $110_1$ and $110_2$. Also, like FIG. 5a, the substrate is prepared with a gate dielectric layer 531 and a first gate electrode layer 534. The first gate electrode layer, for example, serves as a FG electrode.

A buffer layer 641 is formed over the first gate electrode layer. In one embodiment, the buffer layer includes a buffer dielectric material, such as silicon oxide. The buffer dielectric material, for example, may be TEOS formed by CVD. The buffer layer serves as a polish stop. The thickness of the buffer layer may be about 5 to 10 nm. Other types of dielectric material or thickness may also be useful for the buffer dielectric layer. In one embodiment, the overall thickness of the buffer layer, first gate electrode and gate dielectric layer should be equal to about a height of transistor gates.

Figure 6B:
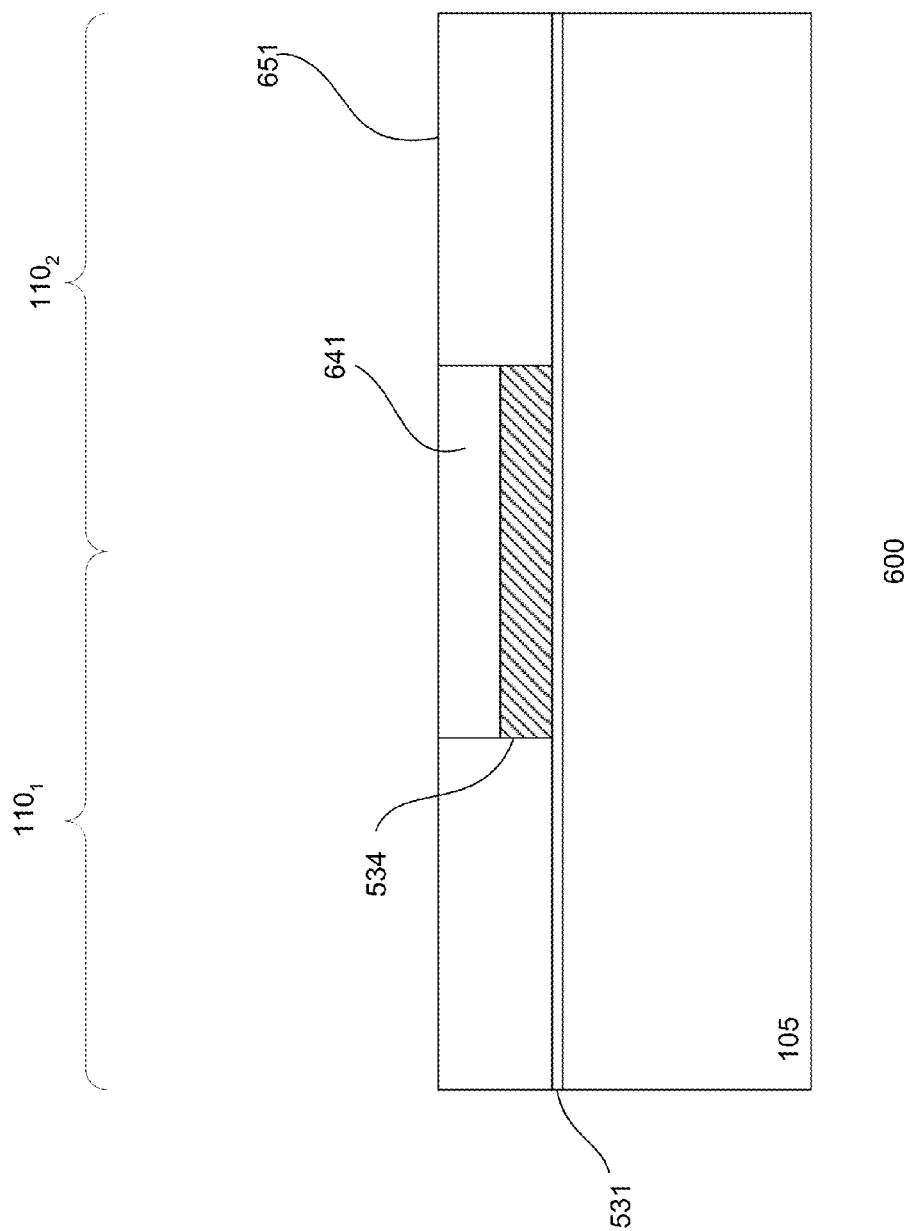
Figure 6E:
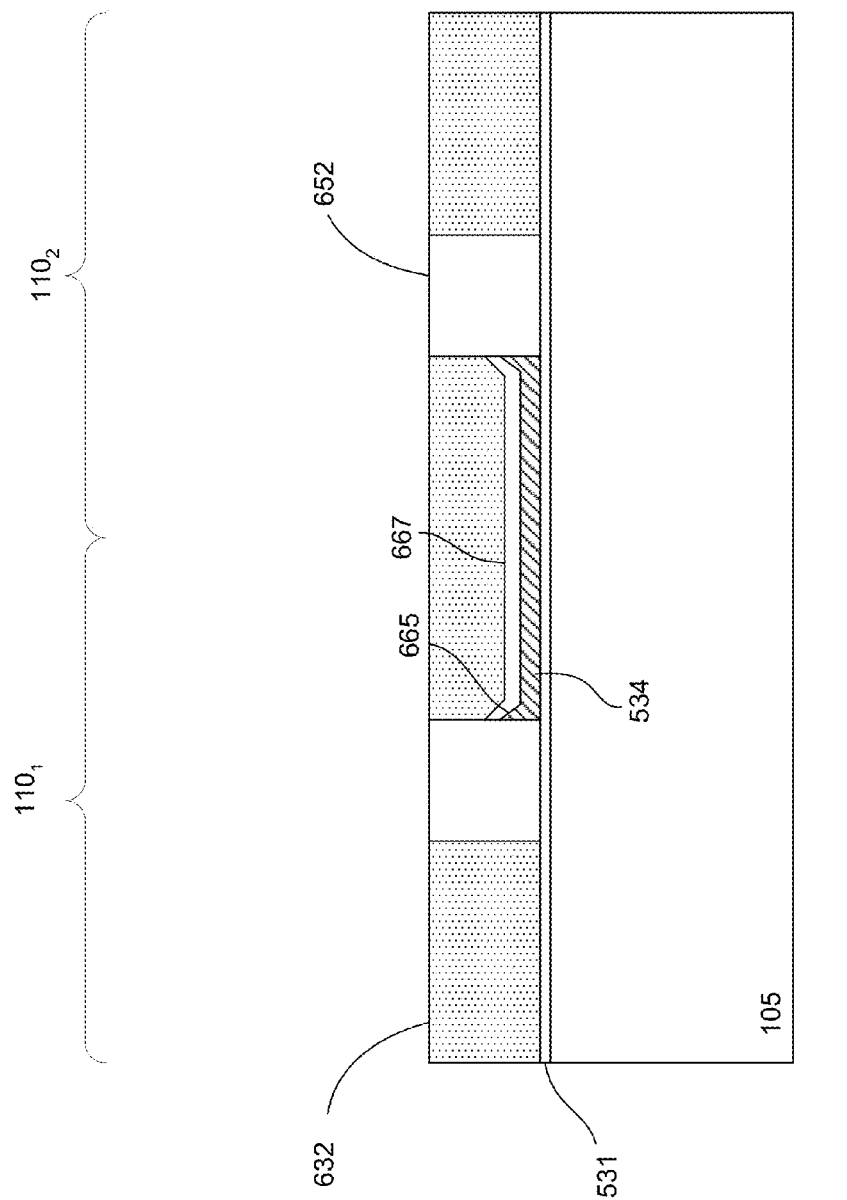

Referring to FIG. 6b, the buffer dielectric and first gate electrode layers are patterned. The patterning leaves the buffer dielectric and first gate electrode layers in a floating gate region. The floating gate region is the region where adjacent floating gates, including the common S/D region between, are to be formed. The gate dielectric layer remains over the substrate. An anisotropic etch, such as a RIE using a soft mask, such as photoresist, may be employed to pattern the buffer dielectric and first gate electrode layers. Other techniques for patterning the layers may also be useful. In some embodiments, multiple etches may be employed.

A sacrificial layer 651 is then formed on the substrate, filling the regions adjacent to the floating gate region. In one embodiment, the sacrificial layer includes a material to which the buffer layer can be selectively removed. The sacrificial material, in one embodiment, includes a dielectric material. For example, the sacrificial material includes silicon nitride while the buffer layer may be silicon oxide. Other combinations of sacrificial and buffer materials may also be useful. Excess sacrificial material is removed by a planarizing process, such as CMP. Other types of planarizing processes may also be used. The planarizing process uses the buffer layer as a polish stop, producing a planar top surface between the buffer dielectric and sacrificial layers.

In FIG. 6c, the buffer layer is removed selective to the sacrificial layer and first electrode layer. Removal of the buffer layer may be self-aligned. For example, no mask is needed to remove the buffer layer. The sacrificial layer is patterned. In one embodiment, the sacrificial layer is patterned to form sacrificial posts 652 corresponding to second common S/D regions of the storage and access transistors. An anisotropic etch using a soft mask may be employed to pattern the sacrificial layer. The etch, for example, may be an RIE selective to the gate dielectric and first electrode layers.

Referring to FIG. 6d, the first electrode layer is processed to form first electrode tips 665. The tips are disposed adjacent to the sidewalls of the sacrificial posts. To form the tips, an anisotropic etch may be employed. For example, an RIE, such as an anisotropic RIE, selective to the sacrificial posts and gate dielectric layer is employed.

An intergate dielectric layer 667 is formed on the first gate electrode layer. In one embodiment, the intergate dielectric layer includes silicon oxide. In other embodiments, the intergate dielectric layer includes a dielectric stack. For example, the intergate dielectric layer includes multiple dielectric layers. The intergate dielectric layer, in one embodiment, includes an ONO stack. The dielectric layer may be formed by thermal oxidation. Other techniques may also be used to form the intergate dielectric layer. For example, the intergate dielectric layer may be formed by CVD or a combination of techniques, such as thermal oxidation and CVD. Other types of dielectric layers or techniques for forming the dielectric layer may also be useful. The thickness of the intergate dielectric layer may be about 100 nm. Other thicknesses may also be useful.

A second gate electrode layer 632 is formed on the substrate, covering the first electrode layer and intergate dielectric layers. The second gate electrode layer, in one embodiment, includes polysilicon. The second gate electrode layer can be formed as an amorphous or non-amorphous layer. In one embodiment, the gate electrode is doped, for example, with first polarity type dopants. Various techniques may be employed to dope the gate electrode, for example, insitu doping or ion implantation. Providing an undoped gate electrode layer may also be useful. Other types of gate electrode materials are also useful. For example, Si—Ge or Ge may be used as the second gate electrode material. The thickness of the second gate electrode layer may be about 50 to 150 nm. Other thicknesses are also useful. To form the second gate electrode layer, techniques, such as CVD, can be used. Other techniques are also useful. Excess second gate material may be removed by a planarization process, such as CMP. The planarization process, for example, uses the sacrificial posts as an etch stop, producing a planar surface between the second gate electrode layer and top of the sacrificial posts.

Figure 6F:
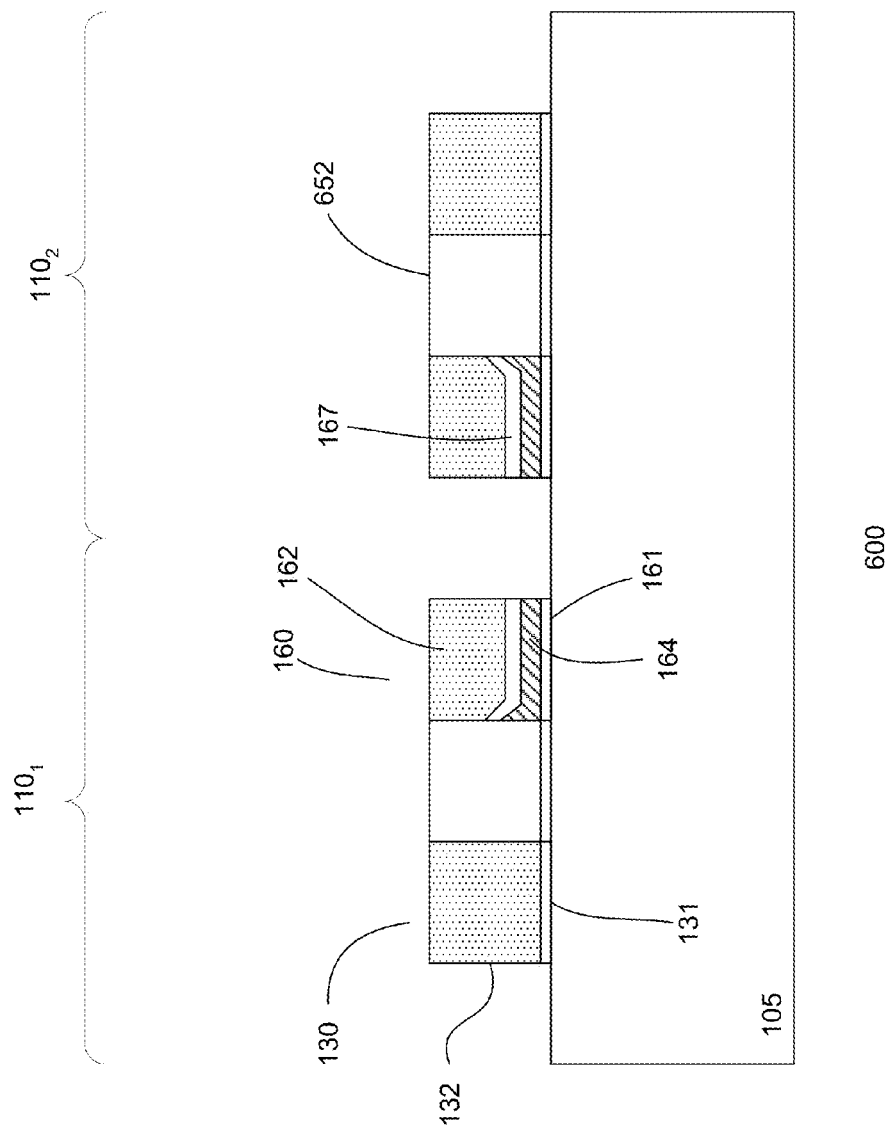

Referring to FIG. 6f, the various gate layers are patterned to define access and storage gates 130 and 160 of the memory cells. The access gate includes an access gate electrode which includes an access gate electrode layer 132. The access gate may further include a second access gate electrode layer 134 (not shown) below and in contact with the access gate electrode layer 132. The access gate electrode is disposed over an access gate dielectric layer 131. The access gate electrode layer 132 corresponds to the second gate electrode layer while the access gate dielectric layer corresponds to the gate dielectric layer. As for the storage gate, it includes a CG 162 over a FG 164. The CG and FG are separated by an intergate dielectric layer 167. The storage gate is disposed over a storage gate dielectric layer 161. The CG and FG correspond to the second and first gate electrode layers while the storage gate dielectric layer corresponds to the gate dielectric layer. The gates, for example, may be gate conductors or lines which extend the length of a row of memory cells.

To pattern the gate layers, a patterned soft mask, such as photoresist, may be employed. The soft mask is patterned to expose portions of the gate layers. For example the mask contains the pattern of the storage gate electrodes. To improve lithographic resolution, an ARC may be provided below the soft mask. An etch is performed to remove the exposed portions of the gate layers to form the gate electrodes. In one embodiment, the etch includes an anisotropic etch, such as a reactive ion etch (RIE). Other types of etch processes may also be used to form the gates.

Figure 6G:
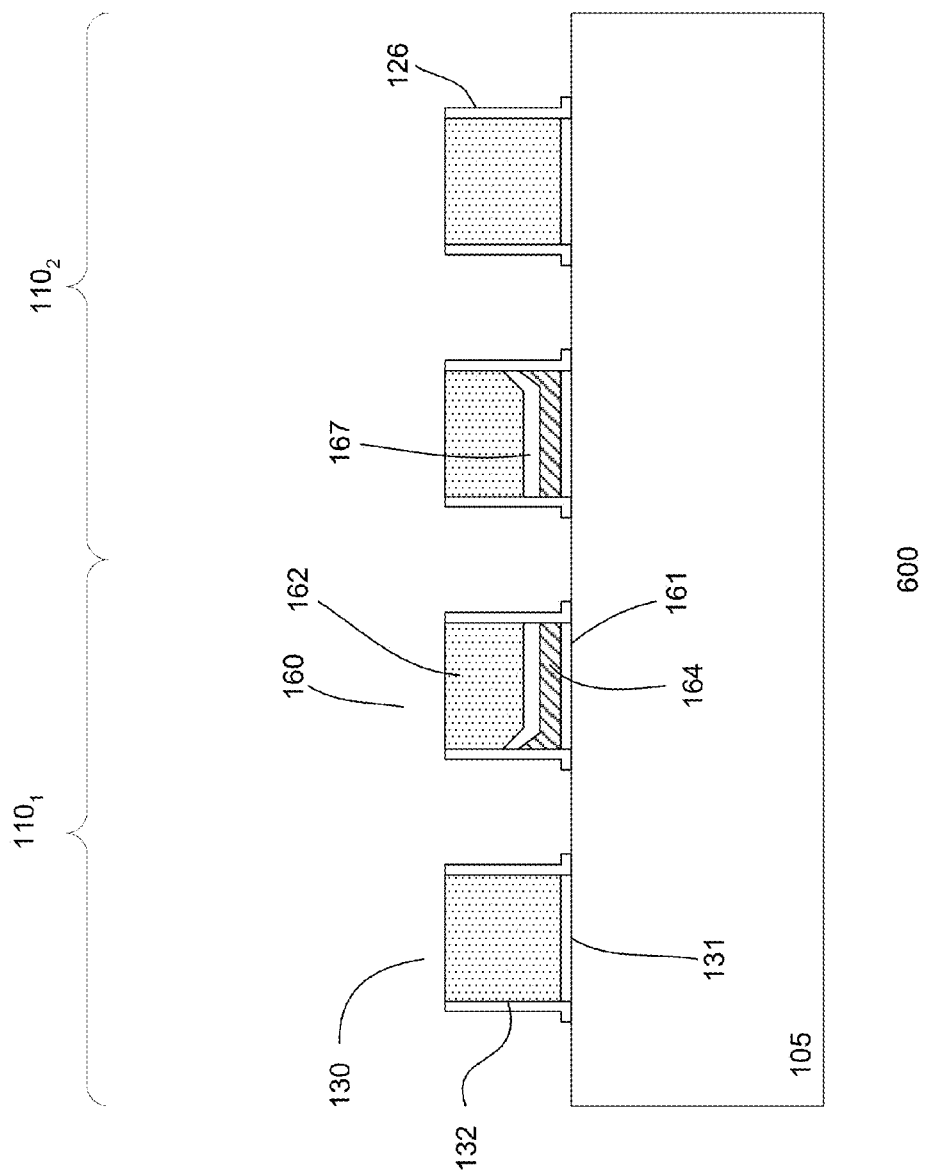

In FIG. 6g, the sacrificial posts are removed, exposing sidewalls of the access and storage gates. The sacrificial posts may be removed using a self-aligned process. For example, the sacrificial posts may be removed by a wet etch or a dry etch. Other techniques for removing the sacrificial posts may also be used. L-shaped spacers 126 are formed on sidewalls of the gates.

Figure 6H:
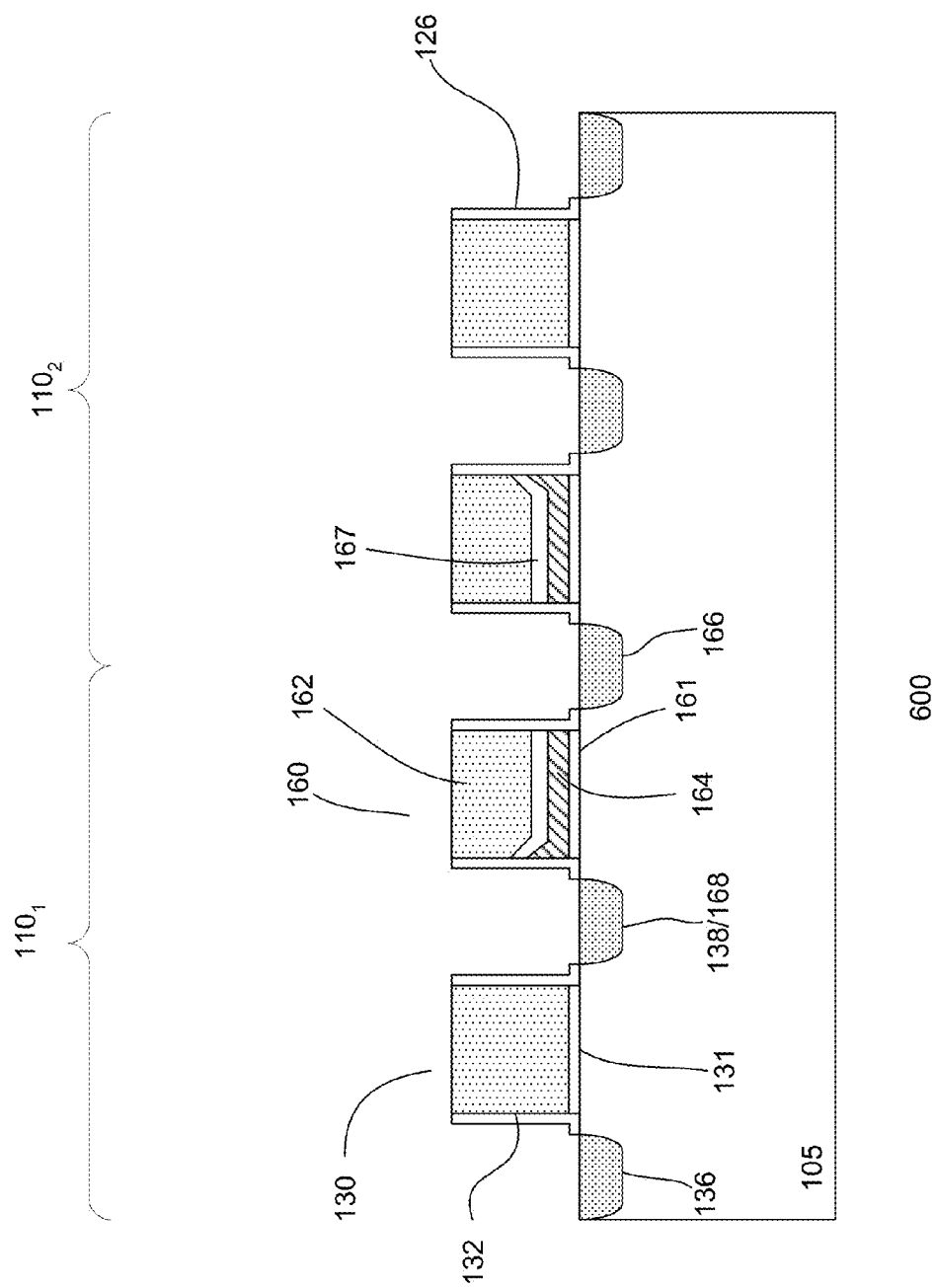

Referring to FIG. 6h, S/D regions of the transistors are formed. In one embodiment, first polarity dopants are implanted into the substrate to form S/D diffusion regions of the transistors. An implant mask may be employed to protect at least the top of the gates. The implant, for example, is a self-aligned implant. The implant forms first and second access S/D regions 136 and 138 and first and second storage S/D regions 166 and 168, with the second access S/D region and second storage S/D region of a memory cell configured as a second common S/D region 138/168 while first storage S/D regions of adjacent memory cells are configured as a first common S/D region 166.

The implant mask layer is removed after forming the S/D regions. For example, the mask layer may be removed by ashing. Other techniques for removing the mask layer may also be useful.

The process continues to form the program gate and erase gate as described with respect to FIGS. 5e- 5j. As such, the components and the steps need not be described or described in detail.

Additional processing can include forming salicide contacts, ILD layer, contacts, and one or more interconnect levels which contain bitlines, PGLs, CGLs SGLs, SL, as well as final passivation, dicing, assembly and packaging. Other processes are also useful. For example, other components, such as LV, IV, HV and I/O devices can be formed prior to forming the interconnections. The memory cells can be formed as a memory device or embedded into a part of ICs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate prepared with a memory cell region, the memory cell region comprises a memory cell, wherein the memory cell includes
      an access transistor and a storage transistor, wherein the access transistor includes first and second access source/drain (S/D) regions and the storage transistor includes first and second storage S/D regions, wherein the access and storage transistors are coupled in series and the second S/D regions being a common S/D region,
      an erase gate being disposed over the common S/D region, and
      a program gate being disposed over the first storage S/D region, wherein such an arrangement of the memory cell decouples a program channel and an erase channel.

2. The device of claim 1 wherein the memory cell region comprises the memory cell and a second memory cell, wherein the memory cells are coupled in series to form a memory cell pair.

3. The device of claim 2 wherein the memory cell corresponds to a first memory cell and the second memory cell comprises:
   an access transistor and a storage transistor, wherein the access transistor includes first and second access source/ drain (S/D) regions and the storage transistor includes first and second storage S/D regions, wherein the access and storage transistors are coupled in series and the second S/D regions being a common S/D region, an erase gate being disposed over the common S/D region, and a program gate being disposed over the first storage S/D region, wherein such an arrangement of the memory cell decouples a program channel and an erase channel; and wherein the memory cells of the memory cell pair are configured as mirror images of each other.

4. The device of claim 3 wherein the first storage S/D region of the first memory cell is common with the first storage S/D region of the second memory cell.

5. The device of claim 1 wherein the erase gate contacts the substrate and common S/D region and isolated from a storage and an access gate by gate sidewall dielectric layers.

6. The device of claim 1 wherein the storage transistor includes first and second storage gate electrodes, wherein:

the first storage gate electrode is a floating gate and the second storage gate electrode is a control gate; and the second storage gate is disposed above the first storage gate.

7. The device of claim 6 wherein the program gate is separated from the first storage S/D region by a program gate dielectric layer.

8. The device of claim 7 wherein the program channel is disposed from an edge of the program gate to the floating gate.

9. The device of claim 8 wherein the erase channel is disposed from an edge of the floating gate to the erase gate.

10. The device of claim 9 wherein the read channel is disposed below the floating gate.

11. The device of claim 6 wherein the floating gate is provided with a sharp floating gate tip disposed on a side of the floating gate adjacent to the erase gate.

12. A device comprising:

a substrate prepared with a memory cell region, the memory cell region comprises at least one memory cell, wherein the at least one memory cell includes an access transistor and a storage transistor, wherein the access transistor includes first and second access source/drain (S/D) regions and the storage transistor includes first and second storage S/D regions, wherein the access and storage transistors are coupled in series and the second S/D regions being a common S/D region, an erase gate being disposed over the common S/D region, and a program gate being disposed over the first storage S/D region, wherein such an arrangement of the memory cell decouples a program channel and an erase channel.

13. The device of claim 12 wherein the storage transistor includes first and second storage gate electrodes, wherein:

the first storage gate electrode is a floating gate and the second storage gate electrode is a control gate; and the second storage gate is disposed above the first storage gate.

14. The device of claim 13 wherein the floating gate is provided with a sharp floating gate tip disposed on a side of the floating gate adjacent to the erase gate.

15. A device comprising:

a substrate with a memory cell region having at least one memory cell, wherein the at least one memory cell comprises an access transistor and a storage transistor, wherein the access transistor includes first and second access source/drain (S/D) regions and the storage transistor includes first and second storage S/D regions, wherein the access and storage transistors are coupled in series and the second S/D regions being a common S/D region, an erase gate being disposed over the common S/D region, wherein the erase gate is isolated from a storage and an access gate by gate sidewall dielectric layers, and a program gate being disposed over the first storage S/D region, wherein such an arrangement of the memory cell decouples a program channel and an erase channel.

16. The device of claim 15 wherein the at least one memory cell comprises first and second memory cells, and wherein the first and second memory cells are coupled in series to form a memory cell pair.

17. The device of claim 16 wherein the first storage S/D region of the first memory cell is common with the first storage S/D region of the second memory cell.

18. The device of claim 15 wherein the storage transistor comprises a second storage gate electrode disposed above a first storage gate electrode.

19. The device of claim 18 wherein the storage transistor comprises an intergate dielectric layer which separates the first and second storage gate electrodes.

20. The device of claim 15 wherein:

the storage transistor comprises first and second gate electrodes; and the first gate electrode comprises a sharp electrode tip disposed on a side of the first gate electrode layer adjacent to the erase gate.

21. The device of claim 15 wherein the program gate is separated from the first storage S/D region by a program gate dielectric layer.

* * * * *